United States Patent [19]
Tan

[11] Patent Number: 6,107,009
[45] Date of Patent: Aug. 22, 2000

[54] PHOTORESIST DEVELOPER AND METHOD

[76] Inventor: Zoilo Cheng Ho Tan, 10630 Madrid Rd., Cupertino, Calif. 95014

[21] Appl. No.: 09/372,471

[22] Filed: Aug. 11, 1999

Related U.S. Application Data

[63] Continuation of application No. 09/060,865, Apr. 15, 1998, abandoned.

[51] Int. Cl.[7] .................................................. G03F 7/32
[52] U.S. Cl. ........................................ 430/331; 510/176
[58] Field of Search ............................. 430/331; 510/176

[56] References Cited

U.S. PATENT DOCUMENTS

| | | | |
|---|---|---|---|
| 4,242,438 | 12/1980 | Sato | 430/278 |
| 4,246,328 | 1/1981 | Sato et al. | 430/5 |
| 4,336,316 | 6/1982 | Sato | 430/5 |
| 4,337,307 | 6/1982 | Neubauer | 430/157 |
| 4,824,769 | 4/1989 | Lewis et al. | 430/331 |
| 4,904,571 | 2/1990 | Miyashita et al. | 430/331 |
| 4,977,056 | 12/1990 | El-Sayed | 430/115 |
| 5,094,934 | 3/1992 | Lazarus et al. | 430/309 |
| 5,130,226 | 7/1992 | Sampei et al. | 430/264 |
| 5,176,985 | 1/1993 | Seitz et al. | 430/284 |
| 5,217,848 | 6/1993 | Uehara et al. | 430/309 |
| 5,223,377 | 6/1993 | Samarakone et al. | 430/330 |
| 5,234,796 | 8/1993 | Shimura et al. | 430/331 |
| 5,292,445 | 3/1994 | Fjare et al. | 252/79.5 |
| 5,346,808 | 9/1994 | Jeffries, III | 430/296 |
| 5,424,164 | 6/1995 | Satomura et al. | 430/138 |
| 5,541,033 | 7/1996 | Blakeney et al. | 430/192 |
| 5,547,814 | 8/1996 | Blakeney et al. | 430/326 |
| 5,585,221 | 12/1996 | Noguchi et al. | 430/280.1 |
| 5,602,260 | 2/1997 | Blakeney et al. | 549/362 |
| 5,637,443 | 6/1997 | Yoshida et al. | 430/325 |

FOREIGN PATENT DOCUMENTS

| | | |
|---|---|---|
| 0 286 272 | 10/1988 | European Pat. Off. ........ G03F 7/26 |
| 85-240479/39 | 1/1984 | Japan . |
| 87-185657/28 | 11/1985 | Japan . |
| 5-6002 | 1/1993 | Japan . |
| 5-100439 | 4/1993 | Japan . |
| 5-88377 | 4/1993 | Japan . |

OTHER PUBLICATIONS

Database WPI, Section Ch, Week 9029, Derwent Publications Ltd., London, GB; Class E16 AN 90–221877, XP002109635 & JP 02 151866 A (Macdermid Inc), Jun. 11, 1990, abstract.

Kaolin Grace Chiong et al., "Contrast and sensitivity enhancement of resist for high–resolution lithography", J.Vac Sci.Technol. B 6(6), Nov./Dec. 1988, pp. 2238–2244.

*Primary Examiner*—Hoa Van Le

[57] ABSTRACT

An aqueous photolithographic resist developer composition including a metal alkali, a dialkylalkanolamine adjuvant, a surfactant, and a buffer increases the speed of novolak resin-based resists exposed to high energy radiation to permit high resolution photolithographic patterning of the resist. A multi-cycle process, in combination with the developer composition of this invention, enables resist resolution capabilities of less than 0.20 $\mu$m, with contrast >5, and dark loss less than 10%.

12 Claims, 15 Drawing Sheets

PHOTORESIST DEVELOPER AND METHOD

CROSS-REFERENCE TO RELATED APPLICATION

This application is a continuation of U.S. patent application Ser. No. 09/060,865, filed Apr. 15, 1998, now abandoned.

BACKGROUND OF THE INVENTION

1. Field of the Invention

This invention relates to photoresist developer compositions and methods of use, and more particularly to metal ion-based, aqueous developer compositions for developing electron beam exposed positive photoresists and method therefore.

2. Description of Related Art

Shrinking semiconductor device feature sizes and increasing circuit densities necessitates improvements in semiconductor fabrication processes and materials, in particular submicron lithography tooling and high-resolution resist compositions. Device fabrication requirements such as high-resolution, and tight overlay creates a need for resists and resist/developer combinations exhibiting high dry etch resistance, high-resolution, high speed, and adequate process and line width control.

The smallest feature (i.e., opening or space) that can be produced in a photoresist layer is referred to as its resolution capability. The smaller the feature produced, the better the resolution capability. Presently, features on an integrated circuit require wafer resist resolution capabilities of about 0.25 microns ($\mu$m). The effort to pack ever-increasing functional density on a semiconductor die, however, results in smaller, more densely packed, device elements. Speed and power consumption requirements of these high density integrated circuits further drive the device designer to use increasingly smaller dimensions. It is anticipated that the smallest feature size in an integrated circuit device will approach 0.13 $\mu$m within the next five years.

Fabrication of these semiconductor devices using photolithographic processes includes forming an image on a semiconductor wafer using a mask. The mask includes a transparent substrate, generally quartz, and a thin layer of patterned material, typically 800 Å of chrome. A photoresist is applied over the mask surface to a thickness of between about 2000 Å–6000 Å. The patterned image on the mask is typically four to five times larger than the circuit to be imaged onto the semiconductor wafer. The reduced image is formed on the semiconductor wafer photoresist by passing actinic radiation through the mask, and focusing the reduced image on the wafer photoresist.

The fabrication of a 0.13 micron ($\mu$m), or 130 nanometer (nm), device on the wafer necessitates improvements in mask making processes and materials. Ideally, a 4x mask must have a resolution of about 0.52 $\mu$m in order to provide 130 nm feature resolution on the wafer. However, proximity effects caused by diffusion of radiation in the wafer photoresist reduces the minimum feature size required on the mask to approximately 0.26 $\mu$m. In some cases, even smaller feature sizes may be required in order to correct optical proximity effects. The Semiconductor Industry Association, a trade association of semiconductor device manufacturers, indicates a minimum feature size of 0.20 $\mu$m on the mask in order to accommodate a 130 nm wafer minimum feature size.

The minimum feature size formed in a photoresist is determined by, among other things, the wavelength of the exposing energy. Resolutions on the order of 130 nm on a wafer require short wavelength radiation such as extreme ultraviolet (where the wavelength, $\lambda$, is approximately 13 nm), x-rays ($\lambda$ of approximately 0.1–5 nm), and high energy electron beams. Accordingly, masks having less than a 0.20 $\mu$m minimum feature size include fabrication processes which must be restricted to these energetic, short wavelength radiation sources.

As electron beam energies provide sufficiently short wavelengths, high resolution masks are typically patterned using a computer-controlled, electron beam writing tool. The electron beam exposes preselected portions of an electron-beam sensitive photoresist deposited on a glass or quartz plate overlaid with a thin layer of metal or metal oxide. The electron beam resist is developed and the exposed metal or metal oxide is etched in the pattern of the desired circuit to produce a mask (for full-wafer exposure), or a reticle containing the pattern for a few semiconductor dies, or one die.

Presently available electron beam resists include poly (methylmethacrylate) ("PMMA"), poly(methylisopropenylketone) ("PMIPK"), poly(butene-1-sulfone) ("PBS"), poly(trifluoroethyl chloroacrylate) ("TFECA"), poly($\alpha$-cyanoethylacrylate-$\alpha$-amidoethylacrylate) copolymer ("PCA"), and poly-(2-methylpentene-1-sulfone) ("PMPS"). These resists are inconvenient in that the PMMA is very insensitive to electron beam and actinic radiation, and the PBS and PMPS degrade at higher temperatures. Such thermal degradation results in low dry etch resistance, thereby requiring that the mask's underlying chrome layer be wet etched. One problem with wet etching, however, is that the etchant undercuts the exposed metal film, widening the feature size by approximately 0.12 $\mu$m on each side. In the case of a space, or channel, in the mask's metal film, the channel width is increased by 0.12 $\mu$m on both sides thereby increasing the channel width by 0.24 $\mu$m over the original, as-exposed feature size. The resulting feature is larger than the desired minimum feature size of 0.20 $\mu$m required to obtain 130 nm resolutions on the wafer. Accordingly, these sulfone-based electron beam resists are unsuitable for masks where a resolution capability of less than 0.20 $\mu$m is required.

Another problem with the above listed electron beam resist compositions is that they require an organic solvent, typically methylisobutyl ketone (MIBK), methylisoamyl ketone (MIAK), methylpropyl ketone (MPK), ethoxyethyl acetate, or 2-methoxyethylene. Moreover, these resists require that the developer solutions also be based on an organic solvent. These solvents represent significant health hazards, and/or flammability hazards, therefore requiring special handling, and disposal considerations. The federal and local regulations governing the use, and disposal of these solvents include abatement equipment, special storage facilities, and monitoring requirements significantly increase the manufacturing costs associated with using an electron beam resist.

Yet another problem with electron beam resists is their relatively low contrast. The pattern resolution attainable with a given resist for a given set of processing conditions is determined, in part, by the resist contrast ($\gamma$). Referring to Prior Art FIG. 1, for a positive resist, the film thickness of the irradiated region decreases gradually with increasing radiation exposure, until eventually the clearing dose $D_c$ is reached, resulting in complete removal of the film upon development. Accordingly, $D_c$ defines the "sensitivity" of a positive resist.

Contrast ($\gamma_p$) is related to the rate of degradation of molecular weight of the exposed resist and is defined as:

$$\gamma_p = 1/[\log_{10} D_c - \log_{10} D_o] \quad \text{Equation (1)}$$

where $D_o$ is the dose at which the developer begins to attack the irradiated film and is defined as the intersection of the extrapolated linear portions of the normalized remaining film thickness versus dose plot. A higher contrast value renders non-exposed portions of the resist less susceptible to photodissolution resulting from scattered reflected radiation by a developer. As a result, higher resolutions are characterized by features having crisp, clean edges thereby starkly delimiting the exposed resist regions from unexposed resist regions.

Still referring to FIG. 1, the parameters defining the resist characteristics include the "dark loss." Dark loss represents the thickness of unexposed resist that is removed by the developer. When dark loss is large, thicker resist films must be initially applied so that the resulting thinner, developed film is able to adequately protect the underlying metal film area of the mask during dry etch. The capability of a particular resist relative to resolution and thickness is measured by its "aspect ratio." The aspect ratio is calculated as the ratio of the as-applied resist thickness to the minimum attainable width of the resist opening after developing.

One problem associated with applying a thicker resist film to compensate for dark loss is that the aspect ratio limitations result in lower resolution capability, longer development times, and larger minimum feature sizes. Accordingly, there is a need for a resist developer composition and method exhibiting lower dark loss to permit using thinner resist films thereby enhancing the resolution capability of the resist.

Positive photoresists such as diazonapthaquinone (DNQ) sensitized phenolic resin (known as novolak resin) are widely available for wafer photolithography processes for producing semiconductor devices. However, these positive resists are optimized for maximum sensitivity to the ultraviolet portion of the electromagnetic spectrum (particularly I-, G-, and H-lines of a mercury vapor lamp) and their performance is linked to proprietary developer formulations that maximize the contrast and speed of the resist at these exposure wavelengths. These developers are typically an aqueous organic-alkali developer such as quaternary ammonium hydroxide. These DNQ/novolak positive resist/developer systems, however, exhibit poor photosolubilization when exposed to an electron beam.

Attempts to overcome the limitations of electron beam resists have failed to attain an on-mask minimum feature size of less than 0.20 µm. U.S. Pat. No. 5,223,377 to Samarakone et al. discloses an interrupted developing process for an on-wafer photoresist. The on-wafer photoresist is exposed to low energy radiation through a mask to thereby activate the photoresist. The mask is removed and the exposed on-wafer resist is subjected to a developer. Samarakone et al. does not disclose first attaining a minimum feature size of less than 0.20 µm on a mask. Accordingly, Samarakone et al. is not helpful in identifying processes and compositions that will enable attaining an on wafer minimum feature size of 130 nm.

Lazarus et al., U.S. Pat. No. 5,094,934 discloses an organic alkali developer, including quaternary ammonium hydroxide, and an alkanolamine or morpholine adjunct, for developing on-wafer quinone diazide sensitized positive photoresists. As in Samarakone, Lazarus discloses an on-wafer resist, and exposure of the resist film to mercury vapor lamp generated ultraviolet radiation through an exposure mask. Lazarus does not teach how to achieve an on-mask minimum feature size of less than 0.20 µm. Moreover, their use of ultraviolet wavelengths to expose the on-wafer resist indicates on-wafer minimum feature sizes in excess of 300 nm.

Improvements in the resist development process have also failed to provide an on-mask minimum feature size of less than 0.20 µm. Chiong et al., "Contrast and Sensitivity Enhancement Of Resists For High-Resolution Lithography", J. Vac. Sci. Technol. B, Vol. 6, p. 2238, November/December 1988, report improvements in contrast profiles of novolak-based photoresists exposed to an electron beam when an interrupted development cycle is carried out. Chiong teaches a repetitive development cycle including a long immersion time in a potassium hydroxide (KOH) developer, followed by a brief deionized water rinse, blow dry, and re-immersion. Moreau reports minimum feature sizes of approximately 0.25 µm. However, these features exhibit significant amounts of scum (i.e., incomplete development). Over-development of the resist to reduce the scum resulted in significant undercutting of the novolak resist.

Accordingly, commercially available electron beam resists exhibit low contrast, are incapable of providing the less than 0.20 µm minimum on-mask feature size necessary to enable photolithographic production of 130 nm semiconductor devices, and/or their organic solvent systems, and organic solvent-based developers render then hazardous and undesirable in a manufacturing environment. Also, positive photoresist systems such as phenolic-based novolak resins in combination with organic alkali developers exhibit high dark loss, poor contrast and poor speed when an electron beam is used to expose the resist. Process enhancements in developing phenolic-based resin resists, while improving the resolution capability of the resist fall short of providing a developed resist having minimum feature sizes less than 0.20 µm. There is a need for a resist/developer/process combination capable of providing resolution capabilities with high contrast and low dark loss.

SUMMARY OF THE INVENTION

The photoresist developer composition of this invention is an aqueous, metal-alkali solution containing an organic alkali adjuvant, a surfactant, and a buffer. The composition exhibits excellent stability upon exposure to air, and provides high resolution, high contrast image patterns in electron beam exposed phenolic resin-based resists. A phenolic resin-based positive photo resist, in combination with the developer composition and improved development process discussed below, produces on-mask minimum feature sizes of less than 0.20 µm with essentially no scum, or undercutting of the developed resin (i.e., vertical developed resist profiles), thereby permitting long development times with minimum dark loss.

Aqeuous solutions used in the developer composition of the present invention include water, and mixtures of water and polar solvents. Alcohols and other polar solvents suitable for use in the developer composition of the present invention include, but are not limited to, methanol, ethanol, isopropanol, glycerol, diethyl ether, tetrahydrofuran, diglyme and mixtures thereof. Additional constituents include other polar, and non-polar compounds such as 2-butoxyethanol which may be added to the aqueous solvent to enhance dissolution of exposed photoresist into the solvent.

Metal alkalis suitable for the developer composition of this invention include alkali metal (group IA) hydroxides, phosphates, carbonates, hydrogen carbonates, and pyrophosphates. The metal alkali is present in the aqueous solution in an amount sufficient to enable the composition to develop the photoresist, typically in the range of from about 1.5% w/w to about 6% w/w. In one embodiment, the amount of metal alkali is greater than approximately 1.5% w/w of an alkali metal hydroxide with good results obtained with a 2% w/w solution.

We have discovered that a metal alkali developer solution will develop electron beam exposed phenolic resin-based resists, when organic-alkali developers, even at twice their normal concentrations, will not form an image on these resists. However, the metal alkali-developed resist is uneven, is poor in contrast and resolution, and includes significant dark loss.

In accordance with one aspect of the composition of this invention, an organic alkali adjuvant is added to complement the metal alkali. We have discovered that the addition of an organic alkali adjuvant, such as a dialkylalkanolamine, significantly improves contrast, reduces dark loss, and improves scum removal. We have further discovered that the dialkylalkanolamine adjuvant modifies the development rate of the resist such that resist erosion is minimized, thus allowing longer development times.

Dialkylalkanolamines suitable for use in the developer composition of this invention are selected from the group consisting of diethylethanolamine, diethylmethanolamine, dimethylethanolamine, dimethylmethanolamine, and mixtures thereof. The dialkylalkanolamine adjuvant is present in an amount sufficient to improve the quality of the metal alkali developed resist. In one embodiment, the dialkylalkanolamine is present in an amount ranging from about 3.0% to about 0.10% w/w, depending on the concentration of the metal alkali.

The total amount of alkali including the metal alkali and the dialkylalkanolamine is greater than about 1.5% w/w with the individual concentrations of metal alkali and dialkylalkanolamine adjusted to reflect the mutual concentrations of alkali in the developer solution. The amount of both metal alkali and organic alkali present in the developer solution ranges from about 1.6% to about 6.1%. In view of the substantial improvement in resist speed when using the developer composition of this invention, DNQ/novolak resists exposed to UV, deep UV (DUV), extreme U.V. (EUV), laser light, electron beam, and x-rays may advantageously use the developer composition of this invention to increase the speed of the phenolic resin-based resist to enable photosolubilization of the resist exposed to these radiation sources.

In accordance with another aspect of the composition of this invention, a surfactant is added to the metal/organic alkali developer composition. We have discovered that a surfactant significantly reduces the amount of scum in the as-developed resist thereby improving the image quality of the developed resist as compared to the developer composition not having a surfactant. The surfactant may be selected from anionic and cationic surfactants. Ionic surfactants suitable for use in the composition of this invention include, but are not limited to, fatty amines, stearyllactates, stearoyllactylates, alkylbenzene sulfonates, alkylated diphenyl disulfonates, polyoxyethylene lanolin, alkyl aryl sulfonates, ammonium perfluoroalkyl sulfonates, alkali metal salts of fluoroalkyl carboxylates, and the like.

In some embodiments an anionic surfactant is selected from the group consisting of ammonium perfluoroalkyl sulfonate having the general formula:

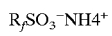
$R_fSO_3^-NH_4^+$   Equation (2)

where: $R_f = C_nF_{2n+1}$; and n is from six to about 12 carbons.

In other embodiments, a potassium fluoroalkyl carboxylate is used. In some embodiments the fluoroalkyl moiety has from about six to about 12 carbons. Particular formulations of the ammonium perfluoroalkyl sulfonate surfactant and the potassium fluoroalkyl carboxylate surfactant are commercially available as Fluorosurfactant FC-120 and Fluoropsurfactant FC-129, respectively, from 3M Corporation, St. Paul, Minn.

In yet other embodiments the surfactant is an alkylated diphenyl oxide (DPO) disulfonate such as benzene, 1-1-oxybis-tetrapropylene sulfonate, and sodium, or other alkali metal, salts of benzene, 1-1-oxybis-tetrapropylene sulfonate. These surfactants are commercially available as Dowfax 2A0, and Dowfax 2A1, respectively, from Dow Chemical Corporation, Midland, Mich.

The 3M and Dow surfactants are present in the composition of this invention in an amount ranging from about 0.001% to about 0.5% w/w.

In accordance with another aspect of the composition of this invention, a buffer may be added to the aqueous metal/organic alkali, surfactant solution. The buffer preserves the composition and may be added in an amount sufficient to prevent pH neutralization of the developer composition of this invention either during storage, or during prolonged developing times of the resist. Suitable buffers include boric acid, and alkali metal salts and alkaline earth metal salts of boric acid, phosphoric acid, acetic acid, silicic acid, and carbonic acid. In one embodiment, boric acid is added in an amount ranging from about 0.6% to about 1.5% w/w.

The developer composition of this invention provides high contrast, high resolution development of electron beam exposed photoresists, in particular, electron beam exposed phenolic resin-based photoresists on either a semiconductor wafer, or on a mask, and an as-developed minimum feature size is of less than 0.20 μm.

In accordance with the method of this invention, a multiple cycle process includes providing the resist developer composition of the present invention, and at least one resist development step followed by a rinse step and a drying step. In one embodiment, the process cycle includes:

1) A first resist develop step, including the steps of:
   spin spraying the developer composition at 100 RPM for 4 seconds;
   spin spraying the developer composition at 20 RPM for 4 seconds; and
   puddle developing the resist at 0 RPM for 22 seconds;

2) A second resist development step, including the steps of:
   spin spraying the developer composition at 100 RPM for 4 seconds;
   spin spraying the developer composition at 20 RPM for 4 seconds; and
   puddle developing the resist at 0 RPM for 22 seconds;

3) A rinse step including spraying the resist with deionized water for 40 seconds; and 4) A drying step including spin drying the resist at 1000 RPM for 100 seconds.

Steps 1) and 2) define a development cycle. Steps 1)4) define a process cycle. It is understood that the cumulative development time (spray development times plus puddle development times) for multiple process cycles is sufficient to ensure complete removal of unwanted resist. Using the process times recited above, each development cycle includes approximately 60 seconds of development time. We have discovered, however, that the speed of a novolak resist increases with an increased number of cycles when using the developer composition of this invention. Accordingly, finer line widths obtained by direct writing of higher energy electron beams (e.g., 50 kV) may be developed using the composition of this invention in combination with a plurality of the above recited process cycles.

In accordance with another aspect of the method of this invention, a minimum spin dry time of approximately 100 seconds produces a developed resist having enhanced contrast, reduced resist erosion, and reduced dark loss as compared to developed resists incorporating a lesser spin dry time between process cycles. In one embodiment, the first process cycle includes a spin dry time of at least 300 seconds, with subsequent process cycles typically having much lower spin dry times of about 100 seconds. By way of theory, and not by limitation, it is thought exposing the surface layers of the phenolic resin-based resist to air during the spin dry step forms an oxidized passivation layer which acts as a barrier against the developer of this invention, thereby essentially eliminating resist erosion, and minimizing dark loss. Accordingly, by using multiple process cycles, including a spin dry with each cycle, any undeveloped resist surfaces exposed during the previous development cycle are oxidized to thereby prevent erosion during future development cycles. As a result, the developed resist boundaries between exposed and unexposed areas of resist are essentially vertical.

Notably, the composition of this invention not only increases the speed of the phenolic resin-based resist to permit pattern imaging from a variety of radiation sources, but also permits a long cumulative development time; i.e., a large number of process cycles. The improved contrast, and minimal dark loss and resist erosion associated with the plurality of process cycles permits fabricating on-mask, or on-wafer, high resolution, minimum feature sizes of less than 0.20 $\mu$m.

BRIEF DESCRIPTION OF THE DRAWINGS

The present invention may be better understood, and its numerous features and advantages made apparent to those skilled in the art by reference to the accompanying drawings.

DETAILED DESCRIPTION

While the invention is described hereinbelow with reference to certain illustrated embodiments, it is understood that these embodiments are presented by way of example and not by way of limitation. The intent of the following detailed description is to cover all modifications, alternatives and equivalents as may fall within the spirit and scope of the invention. For example, it is understood that the speed enhancing capabilities of the developer composition of this invention permits using a variety of radiation sources, including ultraviolet, x-ray, laser, and electron beam radiation sources, to expose a phenolic resin-based resist such as a DNQ/novolak resist system. It is also understood that while the examples set forth below recite potassium hydroxide as the metal alkali component of the developer composition of this invention, other metal alkalis including, but not limited to, those disclosed above may also be used. Similarly, while diethylethanolamine is the specific dialkylalkanolamine recited in the following examples, it is understood that other dialkylalkanolamines, such as those recited above, are suitable for use in the composition of this invention. It is also understood that while the examples disclose spin-coat and spin puddling of the developer onto the resist, it is understood that other photoresist developer processes including immersion development may also be used. Finally, while the following examples are directed to mask fabrication developers and processes, it is understood that the developer composition and processes may be applied to any photolithographic process including thin film magnetic head fabrication, integrated circuit fabrication, and large area thin film transistor (e.g., liquid crystal display) fabrication processes and the like requiring high resolution capable resists.

Experimental Methods

Resist thickness was measured using a Dektak profilometer manufactured by Sloan Technology, model number IIA.

Electron beam exposures for the following examples were performed on an Etec 10 kV MEBES system, and on a Vector Scan 50 kV variable-shaped beam tool.

Figure 1:
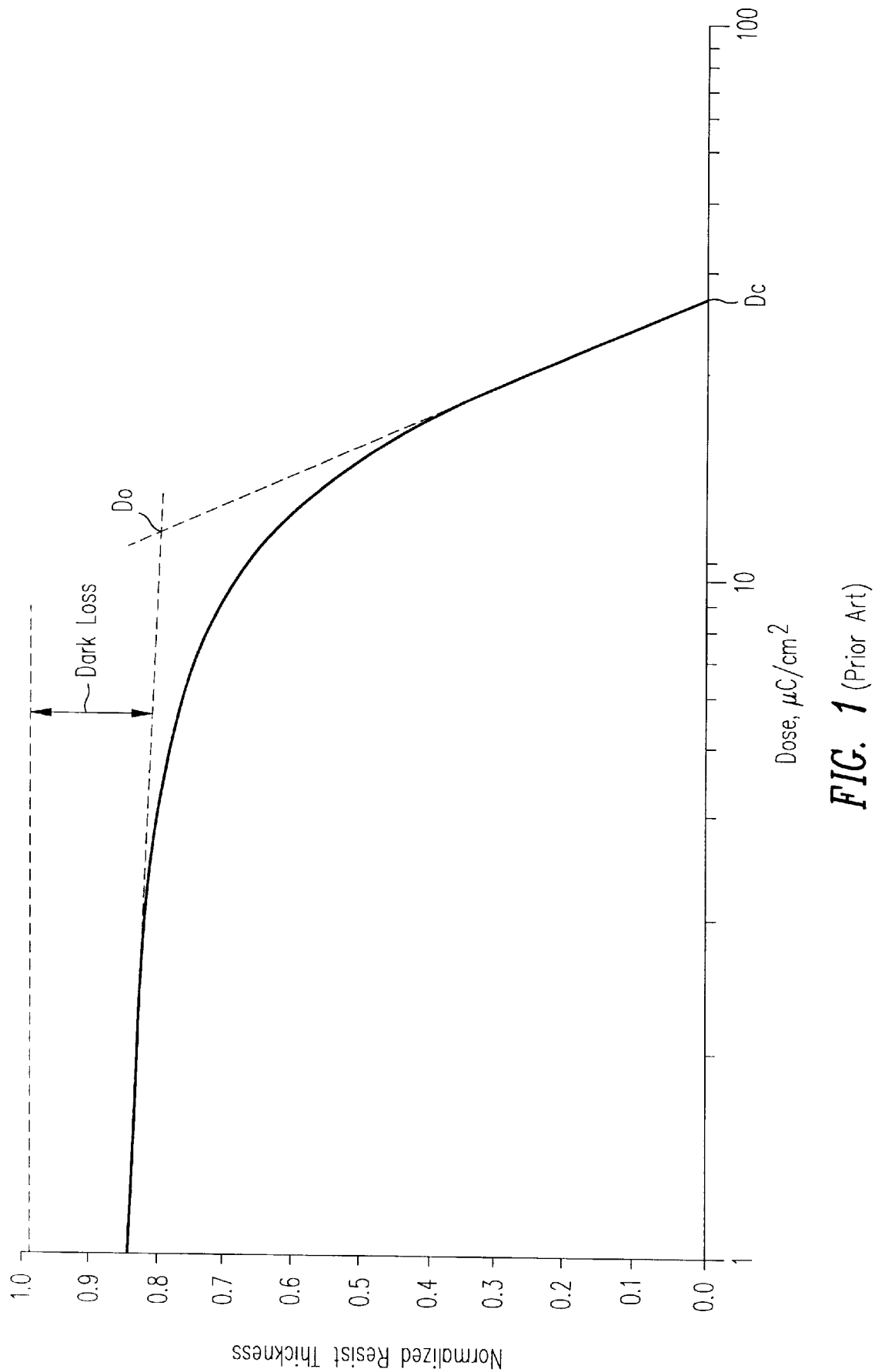
FIG. 1 is a prior art diagram illustrating the principles of resist performance.
Figure 2:
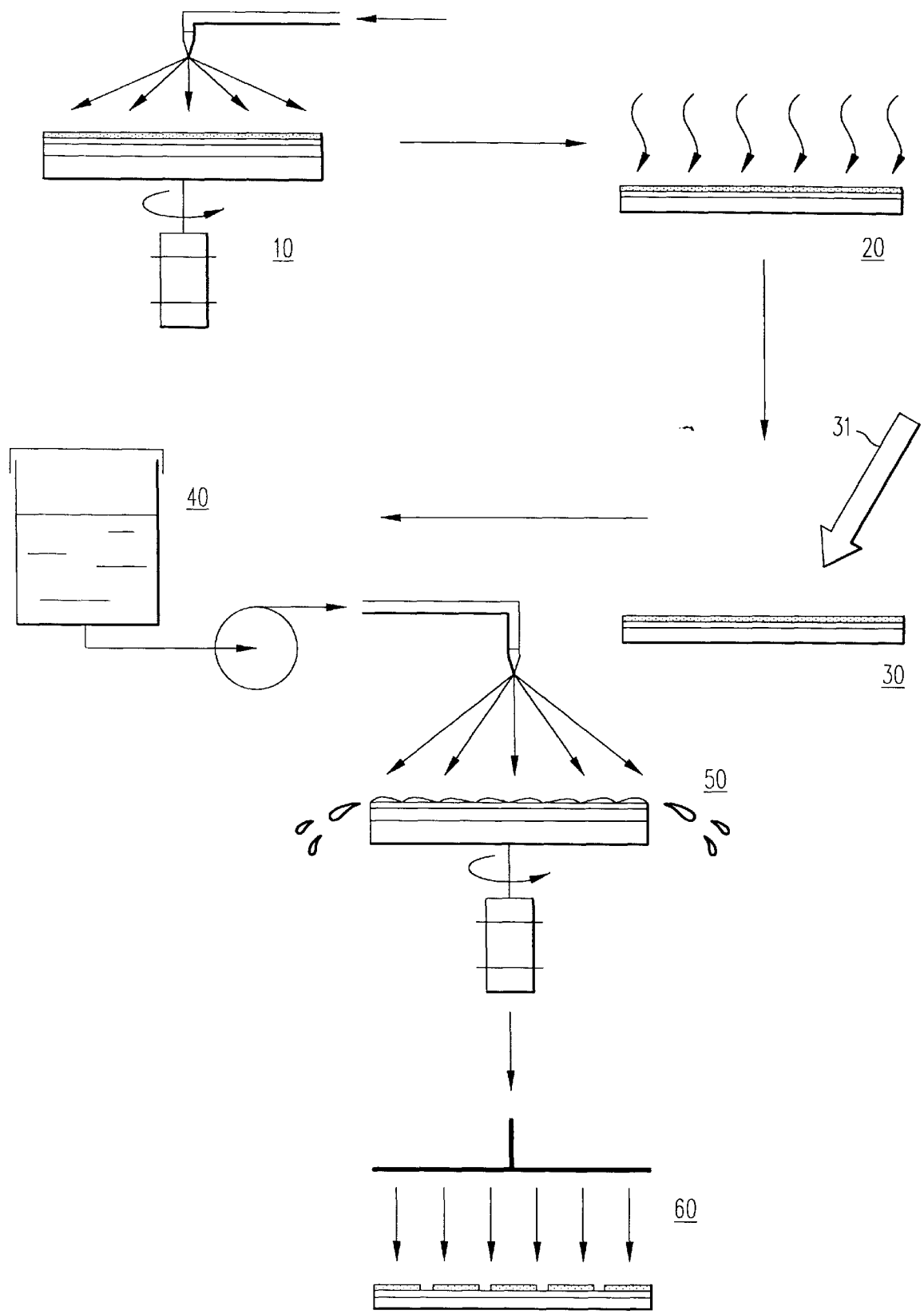
FIG. 2 is a conceptual process flow diagram of the method of this invention.

Referring to FIG. 2, the fabrication of a mask for semiconductor manufacturing includes applying a photoresist at step 10, baking the photoresist at step 20, exposing the photoresist resist coated substrate to a high energy radiation source at step 30, providing a photoresist developer composition of this invention at step 40, developing the photoresist using the multi-cycle development process of the present invention at step 50, and etching the exposed metal film at step 60.

A quartz substrate having a 600 Å–1000 Å metal film formed thereon is cleaned, decontaminated, and dehydration baked prior to applying the photoresist to the metal surface. The mask is also typically vapor primed, generally with hexamethyldisilazane (HMDS), to ensure good adhesion of the resist to the metal film.

The photo resist is applied at step 10 using well known methods, typically by spin-coating to a thickness of about 2500 Å to about 5000 Å. The developer composition and process of the present invention advantageously permits the application of thinner resist films since the as-developed resist exhibits minimal dark loss and high contrast.

The as-coated mask is soft-baked at step 20 to remove any solvents remaining in the resist film. We have discovered that a bake temperature of about 90° C. to about 95° C. for 30–60 minutes to be a factor in the performance of the developer and process of this invention. At bake temperatures lower than about 90° C. the as-developed resist film exhibited poorer contrast and increased dark loss as compared to resist films having a soft-bake temperature between about 90–95° C.

The mask is then exposed to radiation 31 at step 30. The extremely high resolution capabilities enabled by the developer and process of this invention typically require using a direct write technology such as a focused electron beam or ion beam. Surprisingly, the developer and process of this invention increases the speed of the resist, particularly DNQ-sensitized novolak resin-based positive photoresists, so as to render the resist substantially "wavelength independent" in that a broad range of radiation wavelengths may be used to expose the resist. As discussed above, commercially available developers when used to develop electron beam-exposed novolak resists produce either no image or a very poor image as compared to the developer composition and process of this invention.

The developer of this invention is provided at step 40 and includes an aqueous solution of a metal alkali, a dialkylalkanolamine adjuvant, a surfactant, and, optionally, a buffer to preserve the composition. In some embodiments, the developer composition comprises potassium hydroxide in the range of from about 1.5 % w/w to approximately about 6% w/w with particulary good results obtained with 2% w/w potassium hydroxide, diethylethanolamine in the range of from about 3% w/w to about 0.1% w/w with particularly good results obtained with 2.0–2.5% w/w diethylethanolamine. In other embodiments, the composition also includes a surfactant in the range of from about 0.001% w/w to about 0.5% w/w with particularly good results obtained with a surfactant concentration of about 0.01% w/w anionic surfactant, and between about 0.6% to about 1.5% boric acid.

In other embodiments, we have discovered that addition of a commercially available positive photoresist developer, Shipley Microposit 2401, (available from Shipley Company, L.L.C., Marlboro, Mass.) in a 1 to 10 ratio to a stock solution comprising approximately 1% w/w potassium hydroxide, approximately 2.25% w/w dialkylalkanolamine, and approximately 0.9% w/w boric acid produces a developer composition of the present invention having the correct concentration ranges of potassium hydroxide, surfactant, dialkylalkanolamine, and boric acid.

Figure 3:
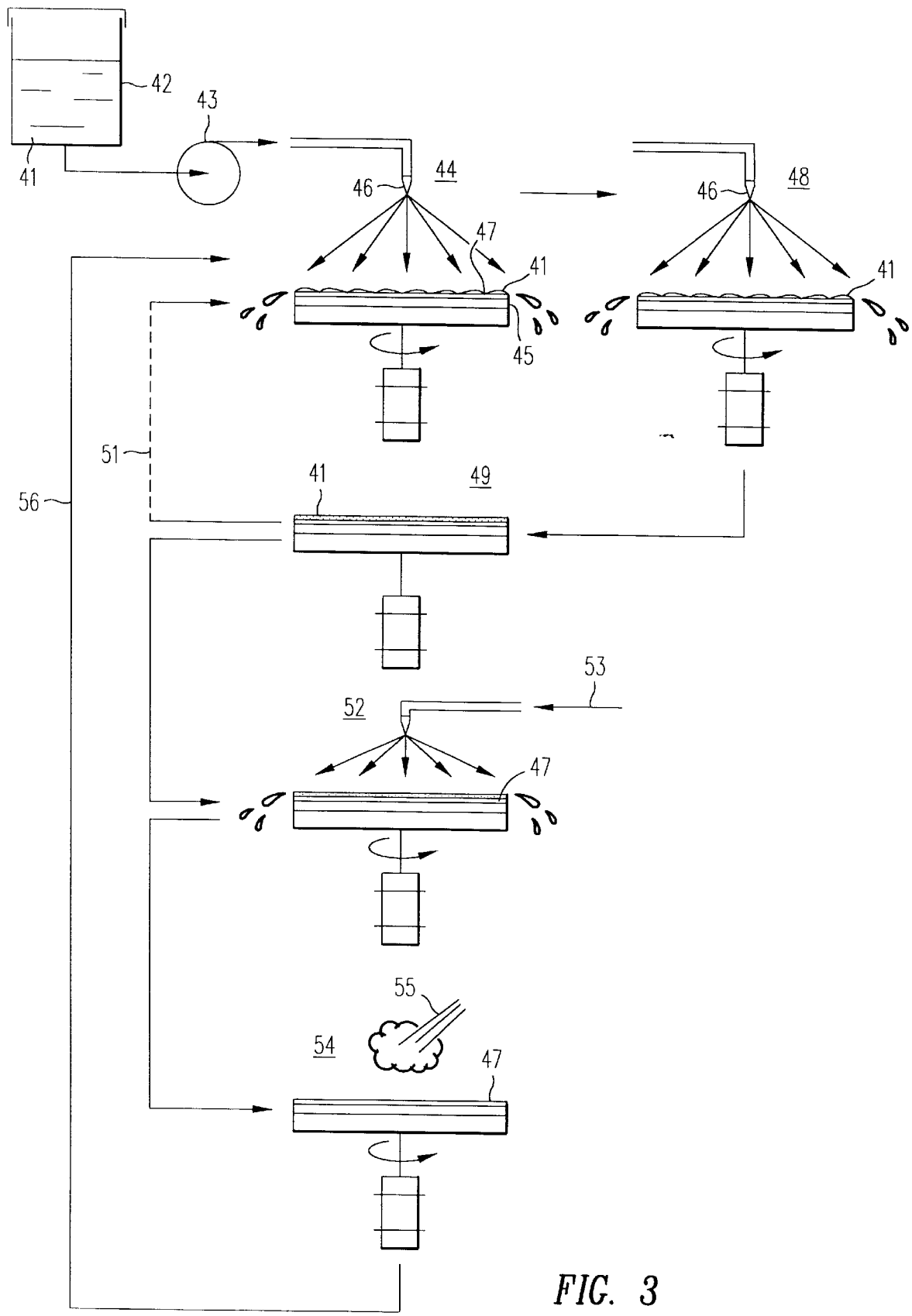
FIG. 3 is a process flow diagram of the multi-cycle process of this invention.

The resist is developed at step 50 using a multi-cycle process wherein each process cycle includes a predetermined number of development cycles with an oxidative exposure step between cycles. Referring now to FIG. 3, the developer composition 41 is pumped via pump 43 from a storage container 42 to a developer spin-spray operation. It is understood that a pressurized tank or any other means for delivering the composition may alternately be used. Each process cycle begins with a development cycle. The mask is spin-sprayed at step 44 wherein developer solution 41 is sprayed onto the rotating mask 45. A spray nozzle 46 ensures that the surface of the mask 47 is flooded with the developer composition. The mask is rotated at approximately 100 revolutions per minute (rpm) for approximately 4 seconds. The mask is then subjected to a low speed spin spray at step 48 wherein the rpm is reduced to approximately 20 rpm and the mask continued to be sprayed with the developer composition 41 for approximately 4 seconds. Puddle development of the resist occurs at step 49 wherein the mask stops rotating and the developer composition 41 is allowed to sit on the resist coated surface of the mask for approximately 22 seconds. The total development time for each development cycle (comprising steps 44, 48, and 49) is approximately 30 seconds. The development cycle may optionally be repeated for as many times as desired as indicated by dashed arrow 51. In the below examples, each process cycle included two development cycles to provide a total of 60 seconds of resist development time per process cycle.

After completing the development cycle(s), the process cycle continues with a spray rinse step 52. Deionized water 53 is sprayed onto the resist surface 47 to remove any residual developer solution. The mask may either be stationary or rotating during the rinse step. Approximately 40 seconds of rinse is sufficient to remove any residual developer solution. The mask is then spin dried at step 54 for approximately 100 seconds at 1000 rpm. Desiccated air 55 rather than dry nitrogen is used to dry the resist surface 47 since it is believed, not by way of limitation, that the presence of oxygen is critical in forming the oxidized passivation layer on the exposed surfaces of the resist. The first process cycle spin-dry step establishes an oxidized resist surface layer. Accordingly, a 300 second spin-dry time may be used at the end of the first process cycle to ensure formation of the surface oxidation layer. Subsequent process cycles may use shorter spin dry periods, for example 100 seconds. The entire process cycle is repeated as necessary, as indicated by arrow 56, until all of the radiation exposed resist is removed.

Figure 4:
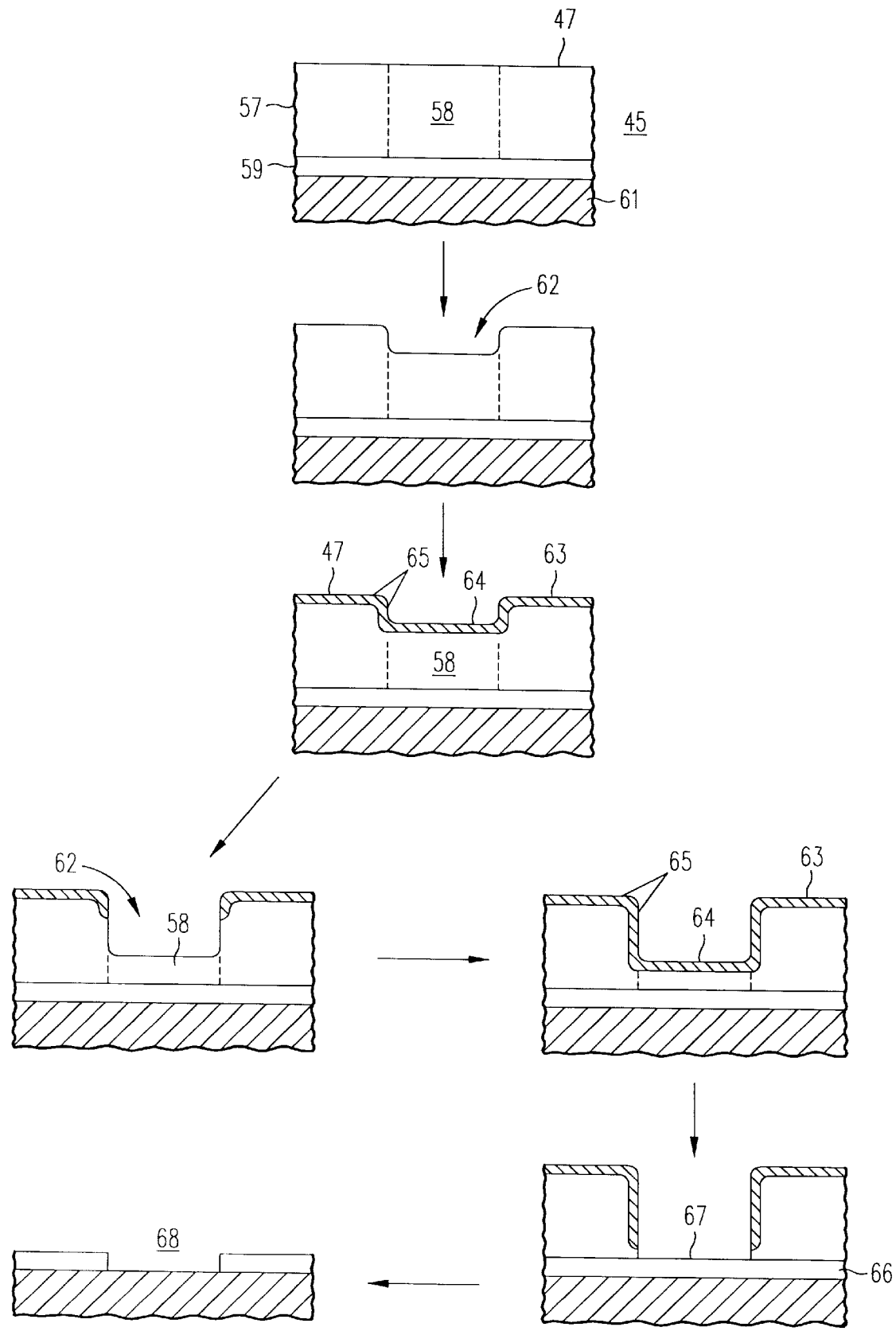
FIG. 4 is a series of mask cross-sections showing the anisotropic dissolution of exposed resist resulting from the formation of an oxidized resist surface layer.

Referring now to FIG. 4, a section of a photomask 45 is shown and includes a novolak resin-based photoresist layer 57, a metal film 59, and a quartz glass substrate 61. The photoresist layer further includes a radiation exposed region 58 and a surface 47. After completion of the first development cycle, a portion of the exposed resist 58 has been solubilized to produce a trench region 62. The spin dry step of the process cycle exposes the resist surface to oxygen in the drying air to form an oxidized resist surface layer 63. It is thought that the oxidized unexposed resist at the resist surface and at the trench walls 65 is relatively insensitive to the developer composition of this invention, as compared to the oxidized exposed resist regions.

Surprisingly, the oxidized surface 64 of the exposed resist region 58, however, continues to be solubilized by the developer composition of this invention to further etch the exposed resist region 58 thereby anisotropically extending the trench 62. Additional spin-dry steps between process cycles results in reformation of the oxidized resist layer 63 at the exposed resist surface 64, and the portion of the trench walls 65 created during the previous development cycle.

The process cycles are repeated until the surface 67 of the metal film 66 is exposed. The metal film is dry etched and the resist layer removed to provide a patterned mask 68. Referring again to FIG. 2, the mask with the patterned resist is dry-etched at step 60. In the examples that follow, and as conceptually shown at step 60, planar plasma etching provides the essentially anisotropic etch needed to produce the nearly vertical sidewalls in the submicron features patterned in the metal film. Alternately, a reactive ion etch (RIE) may be used to pattern the metal film. After etching the underlying metal film, the novolak resin-based positive photoresist is easily removed using solvents such as N-methyl pyrrolidine (NMP), organic acids, or a chromic/sulfuric acid mixture.

EXAMPLE 1

Comparison to Metal Alkali Developer with an Optimized Process

The lithographic performance of Shipley SPR700 diazonapthaquinone-sensitized novolak positive photoresist (available from Shipley Company, L.L.C., Marlboro, Mass.) to a diluted Shipley Microposit 2401 developer was optimized via a designed experiment wherein three independent process parameters were set at three levels. The independent process parameters included soft-bake temperature (levels set at 85, 90, and 95° C.), metal alkali concentration (levels set at 0.29, 0.30, and 0.31 N), and development time (levels set at 80, 160, and 240 seconds). Dependent variables included contrast, dark loss, and sensitivity. All resist samples were coated on a 6×6 inch square, 0.25 inch thick quartz glass substrate using Shipley SPR700 diazonapthaquinone sensitized I-line phenolic resin based-resist. Prior to resist coating, each substrate was vapor-primed with hexamethyldisilazane (HMDS) adhesion promoter. The resist was spin-coat applied to the primed substrate to a nominal thickness of approximately 4,000 Å. All samples were subsequently patterned using a 10 kV, bit-mapped direct write electron beam. The developer comprised potassium hydroxide at the above indicated concentrations.

Figure 7A:
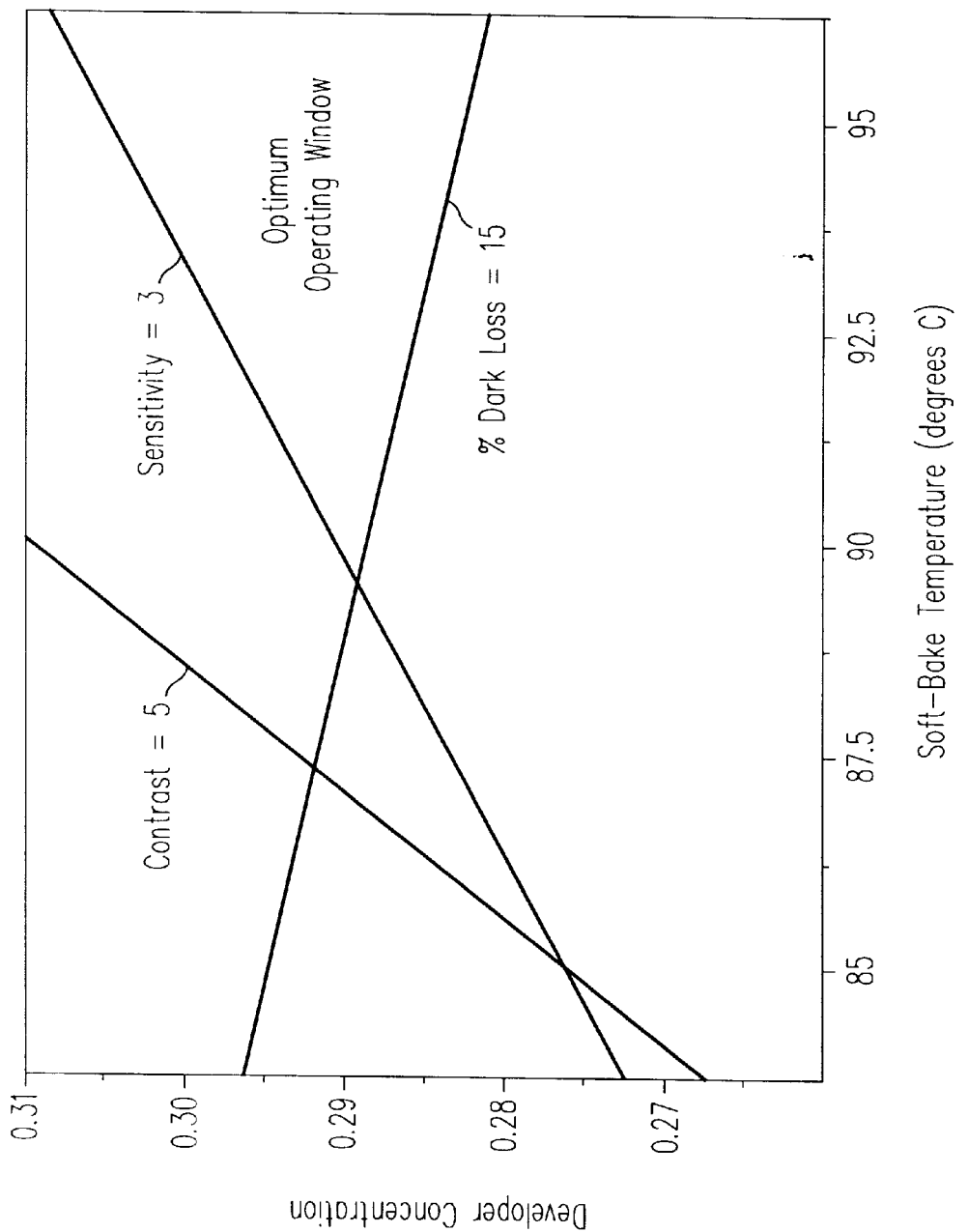
FIG. 7A is a boundary plot identifying the optimum operating window of a potassium hydroxide-based photoresist developer formed from a dilution of Shipley Microposit 2401 developer.

The resist samples were developed according to the experiment design, and the dependent variable values were measured. The boundary criteria for contrast (=5), sensitivity (=3), and dark loss (=15%) are plotted in FIG. 7A. The optimum operating window for a 160 second development time is indicated by the non-shaded triangular region. This region indicates that the soft-bake temperature must be at least approximately 90° C., and the metal alkali concentration at least approximately 0.3 N.

Figure 7B:
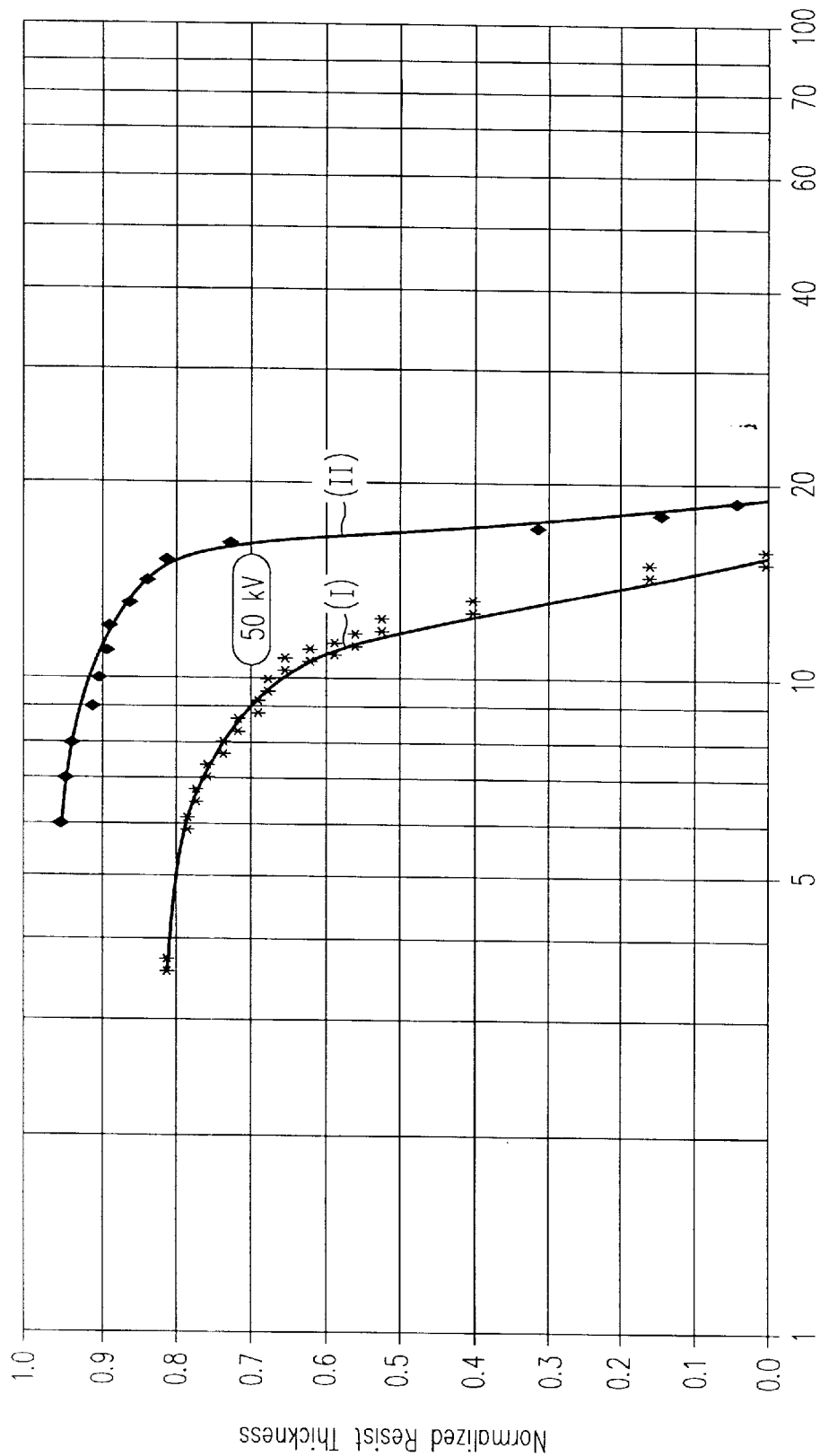
FIG. 7B is a contrast plot comparing the performance of a commercially available resist developer with the developer composition of this invention on an electron beam exposed novolak resist.
Figure 9A:
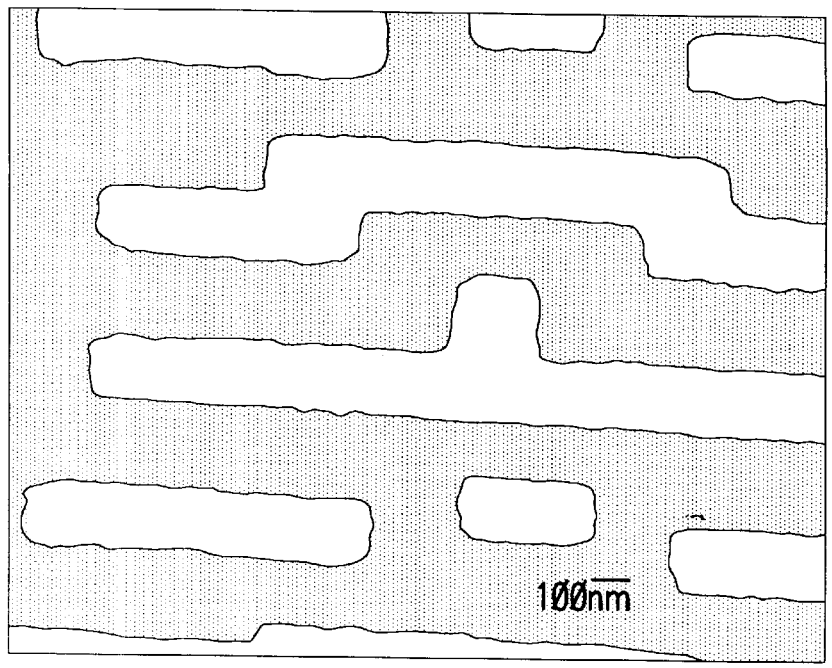
FIGS. 9A–9H are line drawings of SEM photographs of as-developed electron beam exposed resist patterns using the method and developer composition of the present invention.
Figure 9B:
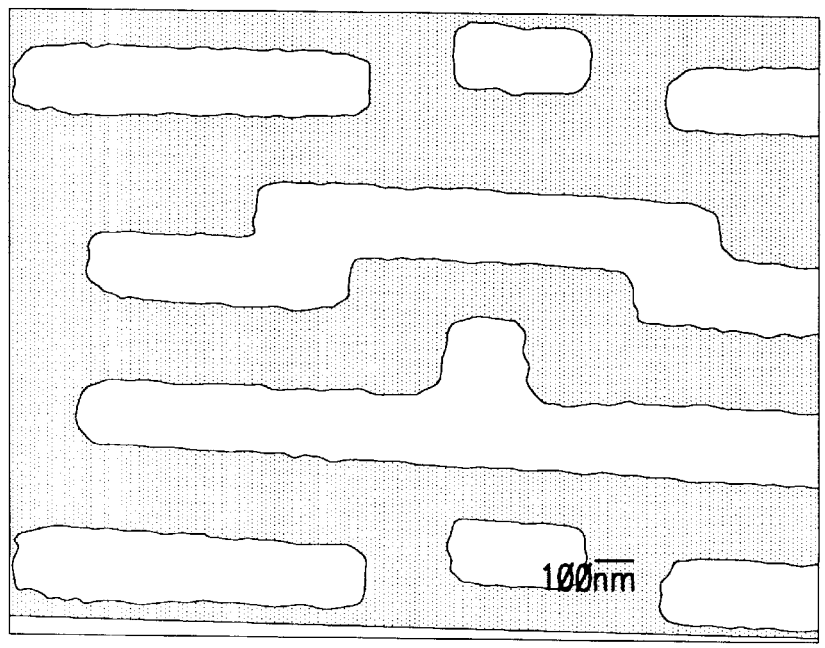
Figure 9C:
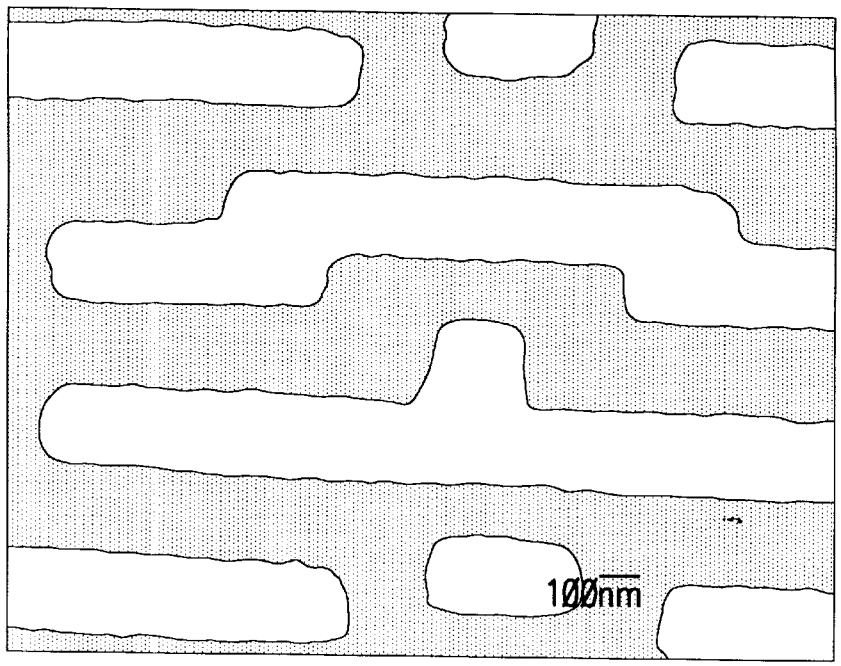
Figure 9D:
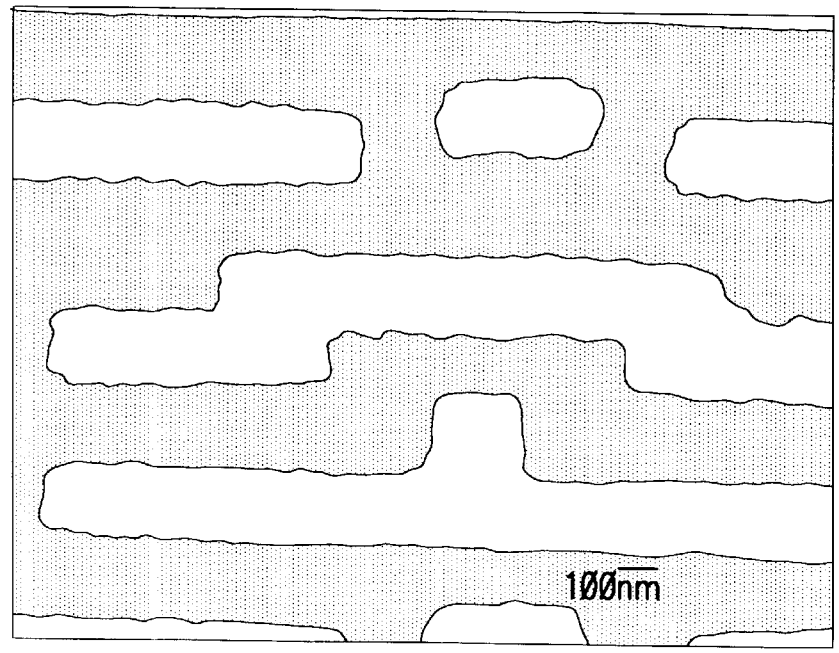
Figure 9E:
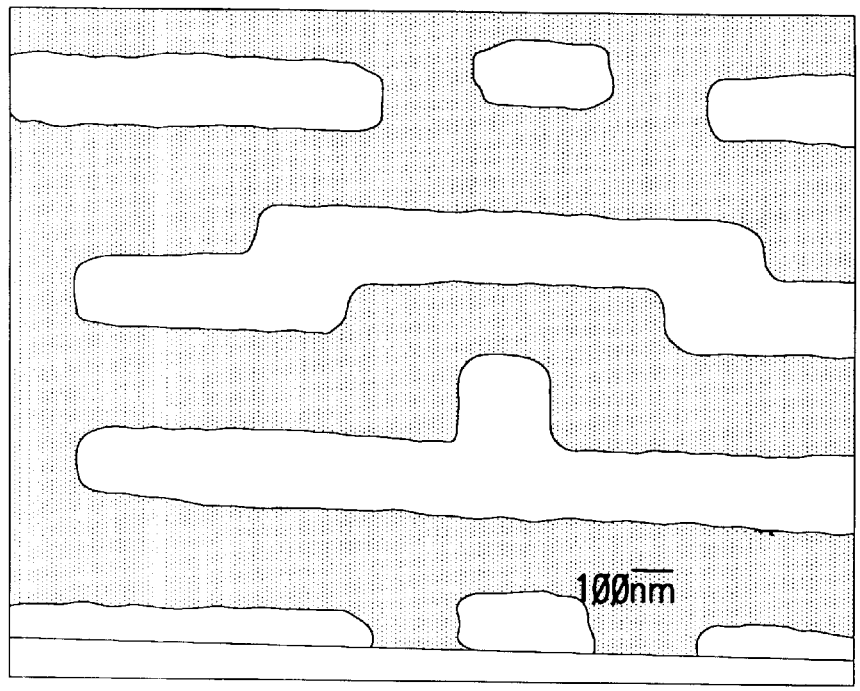
Figure 9F:
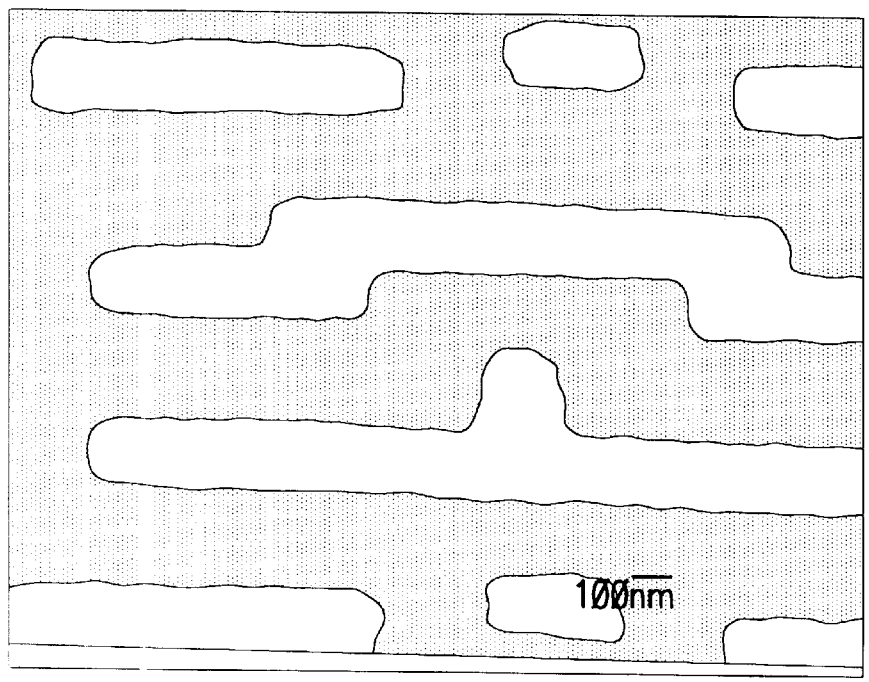
Figure 9G:
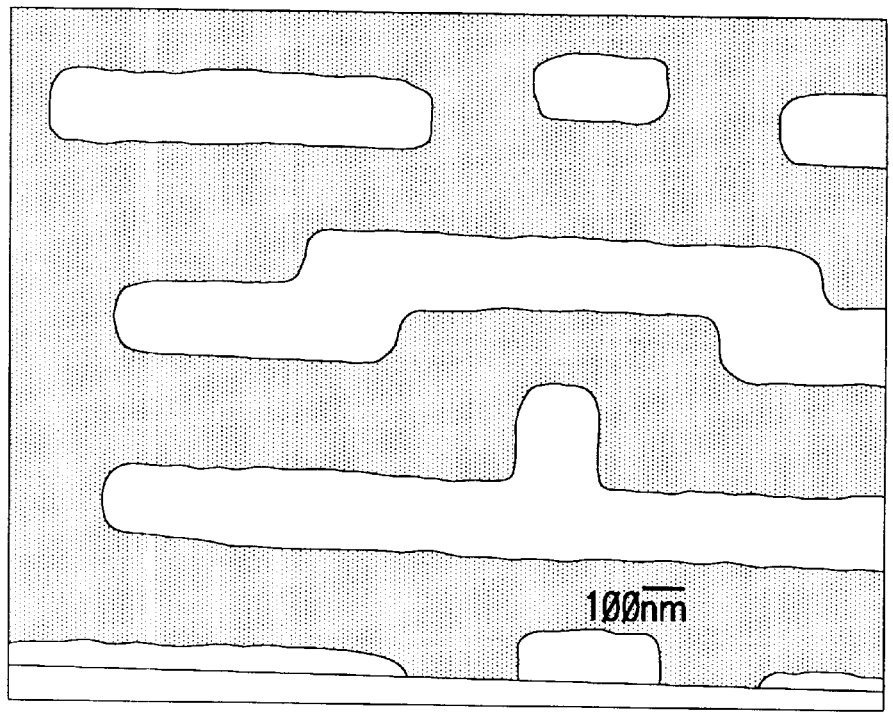
Figure 9H:
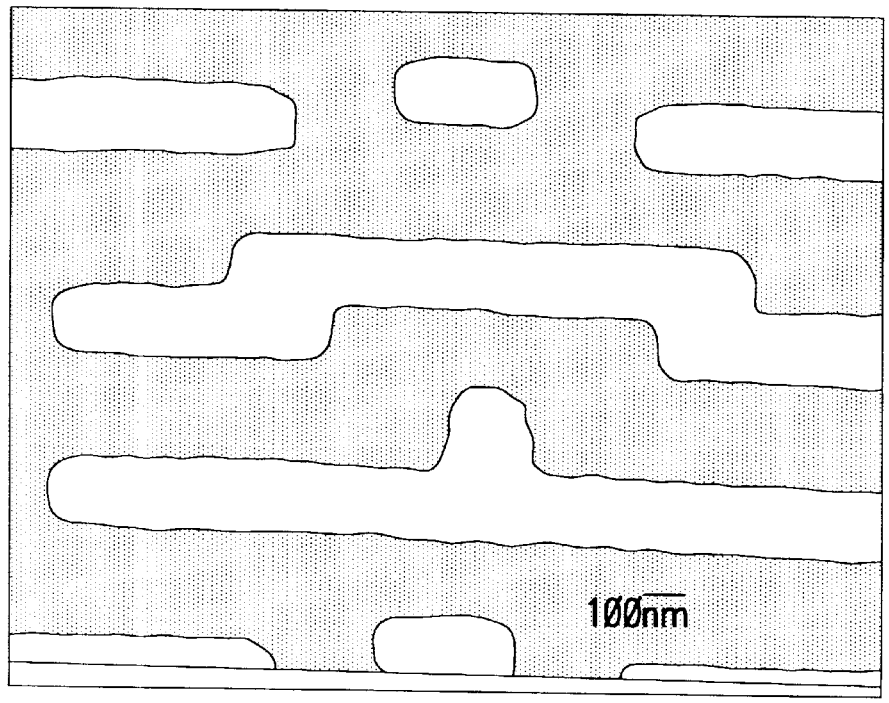

FIG. 7B shows the contrast curves of the Shipley SPR700 resist patterned with a 50 kV electron beam. Contrast curve I shows the performance of the Shipley SPR700 resist when developed using a potassium hydroxide developer and developing process according to the optimum operating values of 0.30 N KOH, 90° C. soft-bake temperature, and a 160 second development time. Curve I exhibits a contrast of 5–6, a dark loss of about 15%, and sensitivity of 15.6 micro-coulombs per square centimeter ($\mu$C/cm$^2$).

Curve II shows the resist performance of a 50 kV electron beam patterned resist, as in Curve I, using the developer composition and multi-cycle process of the present invention. The bulk sensitivity is 19 $\mu$C/cm$^2$, with a contrast of about 10, and dark loss of approximately 5%. The improvement in resist performance over the metal alkali-developed resist as in Curve I is clearly indicated.

EXAMPLE 2

Effect of Organic Alkali Adjuvant

Five resist samples, each on a 6×6 inch square, 0.25 inch thick quartz glass mask substrate, were prepared using Shipley SPR700 diazonapthaquinone sensitized I-line novolak resist. Prior to resist coating, each substrate was vapor-primed with hexamethyldisilazane (HMDS) adhesion promoter. The resist was spin-coat applied to the primed substrate to a nominal thickness of approximately 4,000 Å and then soft-baked at 95° C. for 30 minutes. All samples were subsequently patterned using a bit-mapped direct write electron beam. All samples were then developed using a 3-cycle multi-development cycle process of this invention (i.e., one cycle being 8 sec. spray, 22 sec. puddle, 8 sec. spray, 22 sec. puddle, rinse and dry) to provide a total development time of 180 seconds.

Three of the five samples were reserved as control samples and were developed with Shipley Microposit 2401, a commercially available potassium hydroxide-based developer, diluted by a factor of approximately four to 0.29 N. The diluted Shipley Microposit 2401 also contained less than 0.1% surfactant in addition to the potassium hydroxide. The remaining two samples were developed with an approximately 2.0% w/w KOH and less than 0.1% w/w surfactant (derived from a ten to one dilution of Shipley Microposit 2401), 2.2% w/w N,N-diethylethanolamine, and 0.9% w/w boric acid developer composition of the present invention. The total alkali (inorganic plus organic) was approximately 0.4N. Table I below summarizes the performance of the control developer solution, Shipley Microposit 2401 diluted to 0.29 N, with the developer composition of this invention.

TABLE I

| Sample | Dose ($\mu$C/cm$^2$) | Bit-Map Size ($\mu$m) | Dev. Soln. [a] | MFS ($\mu$m) [b] | Comments |
|---|---|---|---|---|---|
| A | 30 | 0.25 | Con. | 0.29 | Not clean; scummy. |
| B | 33 | 0.25 | Con. | 0.30 | Not clean; scum on edges. |
| C | 36 | 0.25 | Con. | 0.31 | Edges not clean. |
| D | 40 | 0.25 | Exp. | 0.25 | Clean; no scum. |
| E | 40 | 0.175 | Exp. | 0.173 | Clean; no scum |

[a] Con. = control (diluted Shipley Microposit 2401; Exp. = 2.0% w/w KOH, 2.2% w/w N,N-diethylethanolamine, 0.1% w/w surfactant, and 0.9% w/w boric acid composition of this invention
[b] MFS is the minimum feature size as defined by the minimum line width resolution possible on the sample.

Figure 5A:
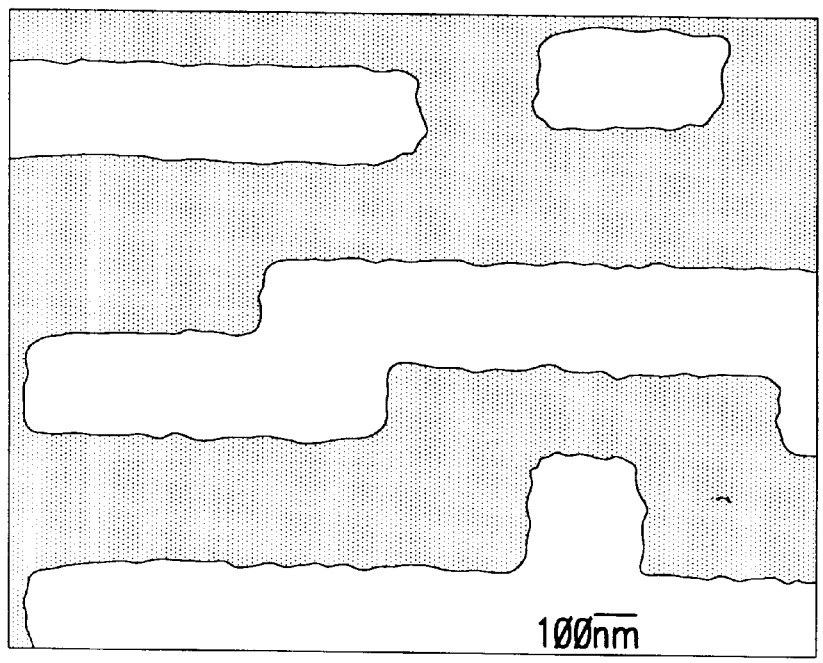
FIGS. 5A–5E are line drawings of scanning electron microscope photographs comparing the performance of commercially available developers with the developer composition of the present invention.
Figure 5B:
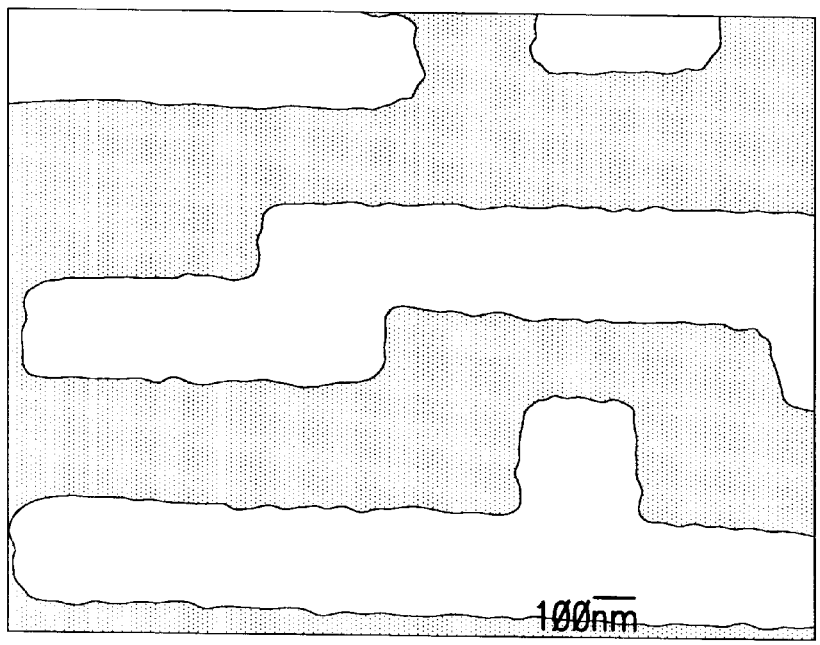
Figure 5C:
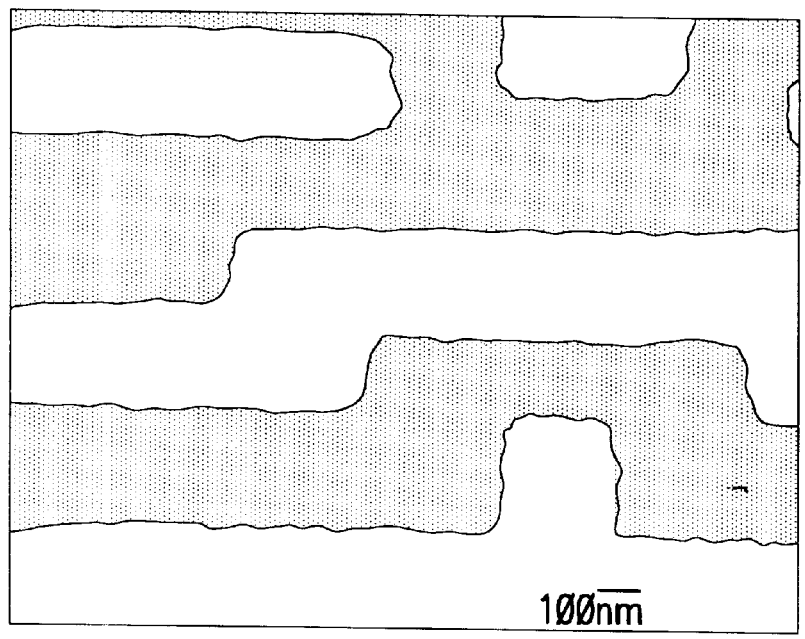

The samples D and E developed with the developer composition of this invention produced superior results as compared to the samples developed using the control developer, samples A, B and C. FIGS. 5A, 5B and 5C are the respective line drawings of scanning electron microscope photographs of control samples A, B, and C of Example 2. FIG. 5A clearly shows undeveloped resist and debris within the developed resist channel. FIG. 5B, corresponding to control sample B, also shows ragged resist boundaries, and scum and debris at the resist boundaries within the developed resist channel. The increased dose of 33 $\mu$C/cm$^2$, however, of control sample B appears to have resulted in less scum as compared to sample A, which was dosed at 30 $\mu$C/cm, as seen in FIG. 5A. The control sample A resolution (as measured by the minimum line width), however, has decreased from 0.291 $\mu$m to about 0.30 $\mu$m for control sample B. The decreasing resolution of the developed resist with increasing electron beam dose is further verified by control sample C, as shown in FIG. 5C. Although FIG. 5C shows an improvement in scum as compared to control samples A and B, the increased dose of 36 $\mu$C/cm has resulted in the resolution degrading to approximately 0.31 $\mu$m. Resist erosion is also evident in FIG. 5C in that the corners of the developed resist are rounded. Accordingly, control samples A, B, and C show that commercially available novolak resist developers, such as Shipley Microposit 2401, are not able to provide a high resolution, scum-free, as-developed electron beam-exposed resist capable of producing 0.20 $\mu$m minimum feature sizes on the mask.

Figure 5D:
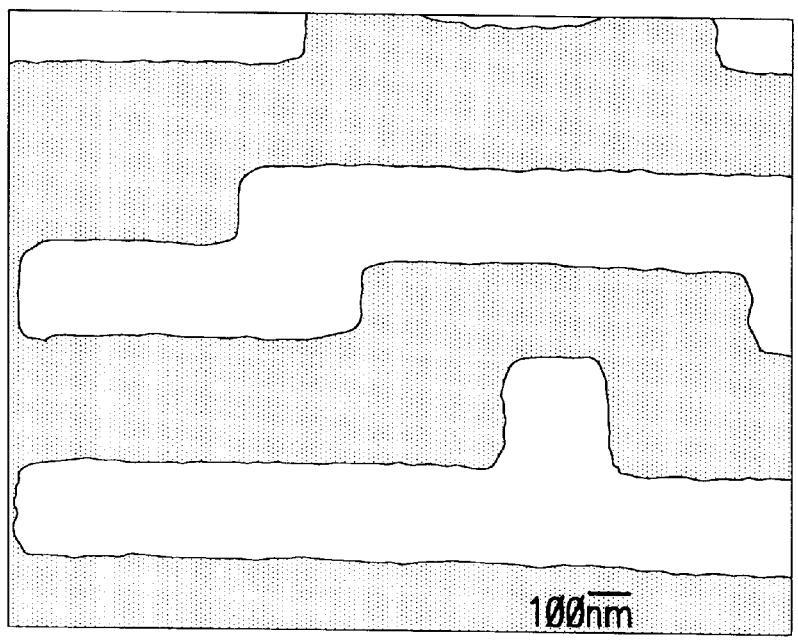
Figure 5E:
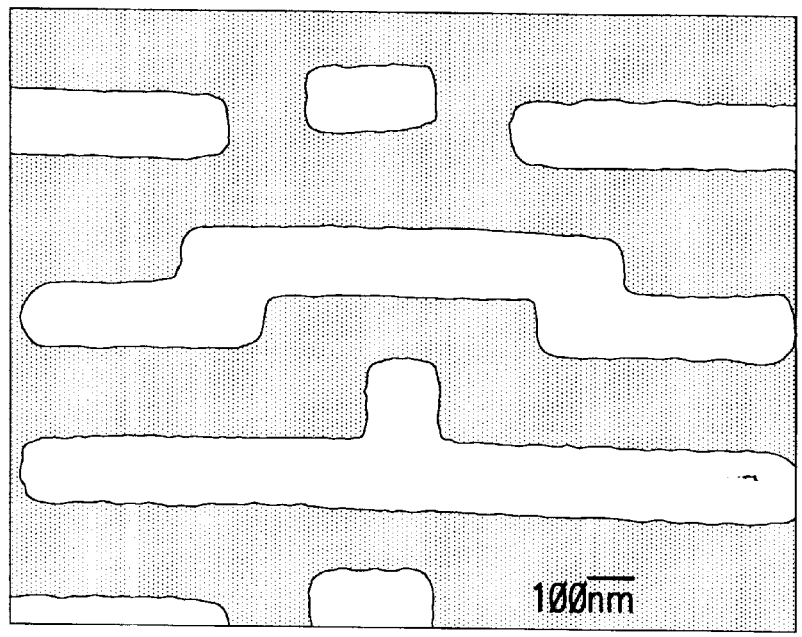
Figure 6A:
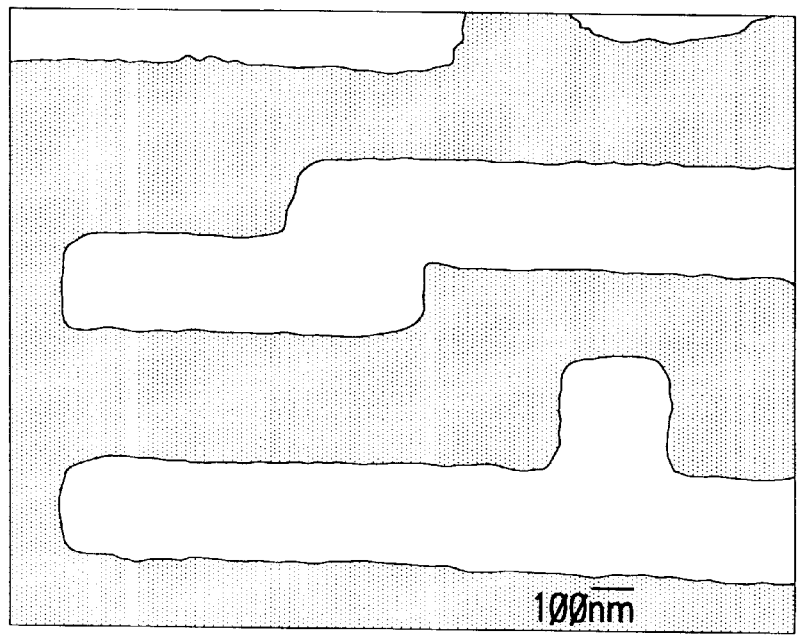
FIGS. 6A–6D are line drawings of scanning electron microscope photographs of an as-developed commercially available electron beam resist.
Figure 6B:
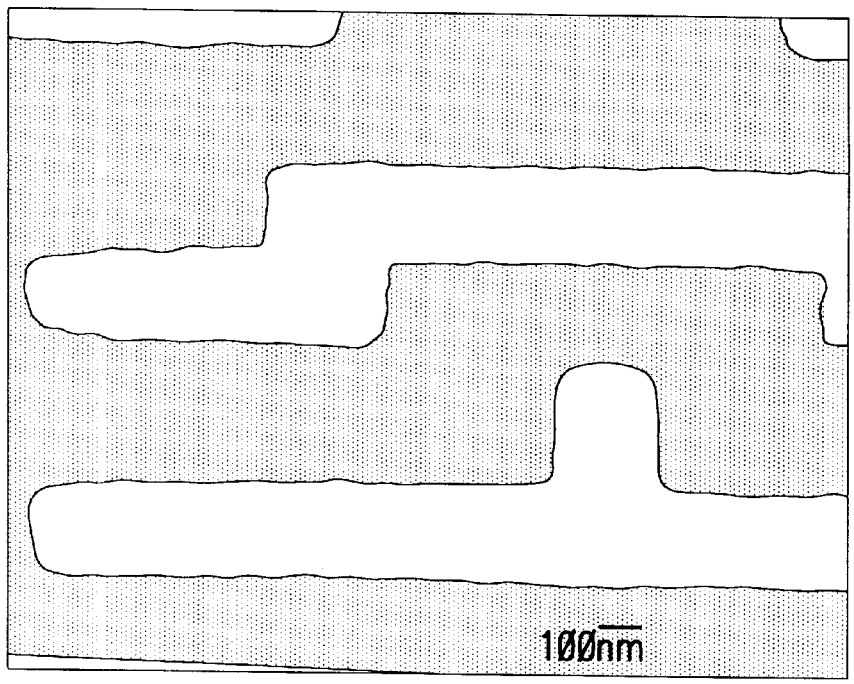
Figure 6C:
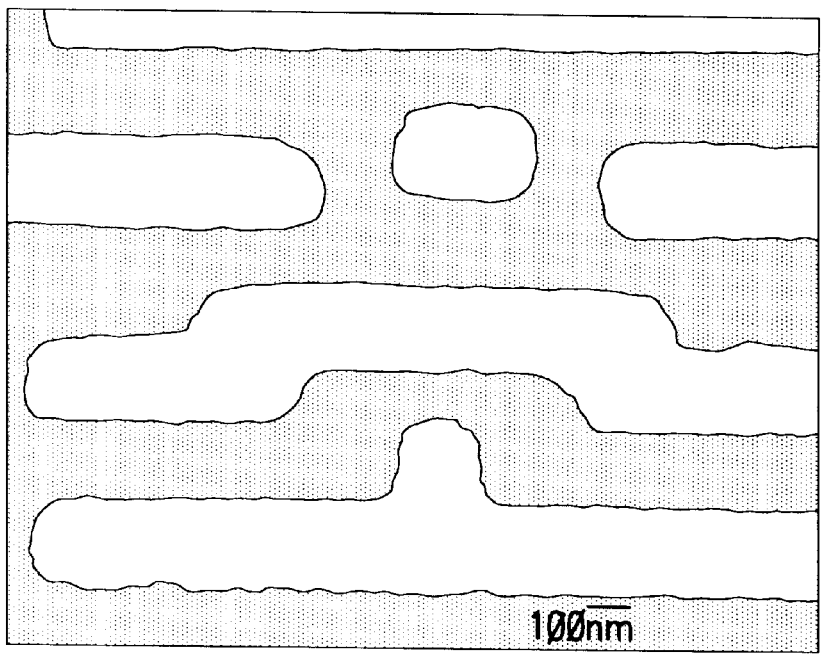
Figure 6D:
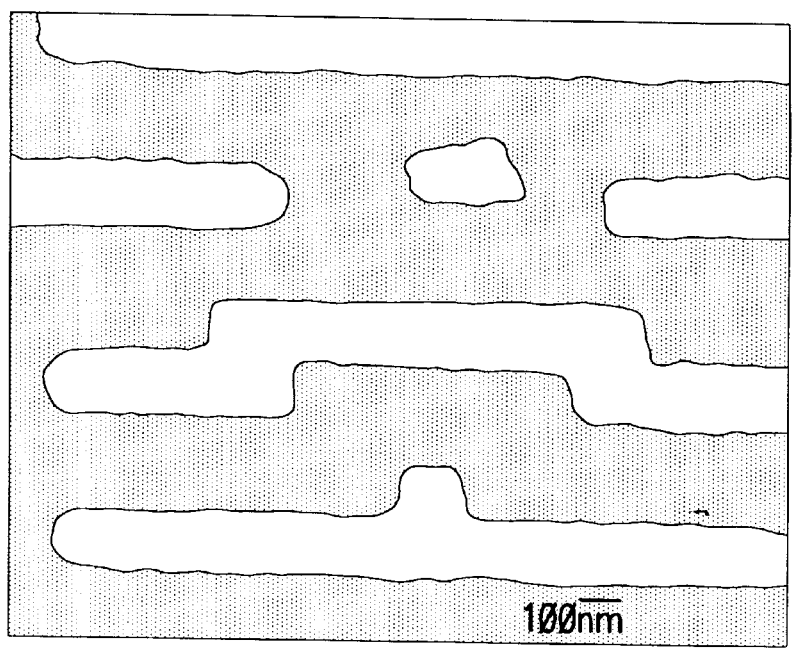

By comparison, samples D and E of Example 2 were developed with the developer composition of the present invention. FIG. 5D, corresponding to sample D of Example 2, shows an as-developed electron beam-exposed resist pattern free of debris and scum, and having a line width of 0.254 $\mu$m. This line width is essentially the same size as the electron beam bit size used to write the pattern on the resist. In sample E, as shown in FIG. 5E, the electron beam bit size was reduced to 0.175 $\mu$m to determine if the minimum feature size would also be correspondingly reduced. Surprisingly, the developer composition and process of the present invention produced a clean, scum-free high resolution etch pattern having a minimum line width size of 0.173 µm. This line width represents a minimum feature size that is essentially equal to the electron beam bit-map size, thus suggesting that the resolution capability of the DNQ/ novolak resist, at these resolutions and using the developer and composition of this invention, is limited by the size of the electron beam used to expose the resist and not by other lithographic variables. Accordingly, significant improvement in resolution may be attained using the developer composition of this invention in combination with the process of this invention.

Figure 8:
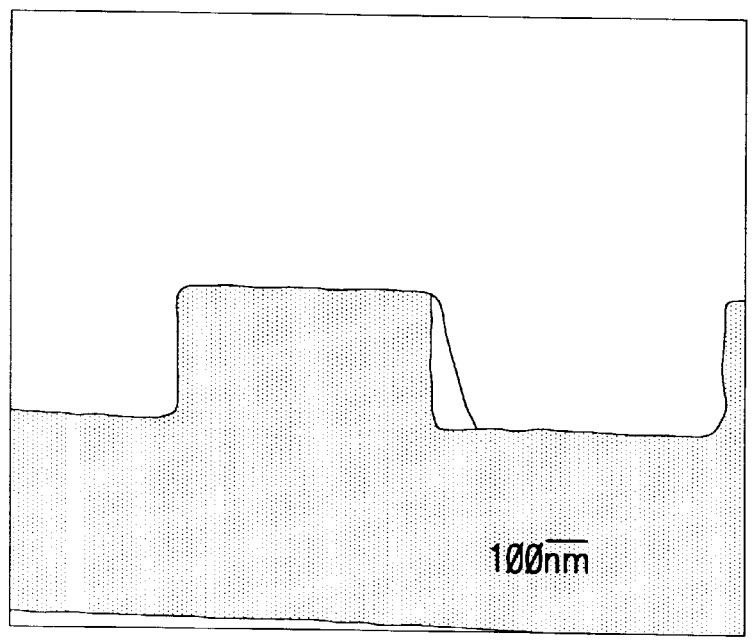
FIG. 8 is a line drawing of a scanning electron microscope photographer of a resist cross-section.

FIG. 8 is a line drawing of a scanning electron microscope photograph of a cross section of Shipley SPR700 resist developed with the developer composition of this invention (an aqueous solution of 2% w/w KOH, 2.2% w/w diethylethanolamine, less than about 0.1% surfactant, and 0.9% boric acid) using eight process cycles of the development process of this invention to provide 480 seconds of total development time. The resist was exposed with an electron beam dose of about 37.5 µC/cm² at an energy of about 50 kV. It can clearly be seen that all of the exposed resist has been removed as indicated by the sharp intersection of the vertical resist wall and the substrate surface. Moreover, the absence of resist erosion and undercutting, is clearly indicated by the straight, vertical resist walls.

EXAMPLE 3

Performance of Commercial Electron Beam Resist and Developer

The performance of the developer composition/process of the present invention as shown in samples D and E of Example 2 is compared to the performance of a commercially available novolak resin-based electron beam resist, EBR900, manufactured by Toray Industries, Incorporated, of Chiba, Japan. Resist samples F, G, H, and I of Table II were prepared as in Example 2 using electron beam resist EBR900. The developer recommended by the EBR900 manufacturer, MA50, was used to develop the exposed EBR900 electron beam resist according to the process parameters set forth in Table II below.

TABLE II

| Sample | Dose (µC/cm²) | Bit-Map Size (µm) | Dev. Proc. a) | MFS (µm) b) | Comments |
|---|---|---|---|---|---|
| F | 48 | 0.25 | Single | 0.29 | Not clean. Scummy. |
| G | 48 | 0.25 | Multi | 0.26 | Edges not clean. |
| H | 48 | 0.18 | Single | 0.30 | Very scummy. Low resolution. |
| I | 48 | 0.18 | Multi | >0.30 | Very dirty. Very poor resolution. | a) Single = control process of a single 105 second puddle development. Multi = 6 cycles of a dual development cycle to provide 480 seconds of development time.
b) MFS is the minimum feature size as defined by the minimum line width resolution possible on the sample.

FIGS. 6A, 6B, 6C, and 6D are line drawings of scanning electron microscope photographs corresponding to samples F, G, H, and I of Table II respectively. All of these figures show ragged edges, and varying degrees of scum in the electron beam exposed portions of the resist. None of the EBR900 resists exhibited minimum feature sizes less than the desired 0.20 µm when developed with the manufacturer's recommended developer composition. It is clear that the commercially available electron beam resist EBR900, developed with the recommended commercially available developer composition MA50, is unable to provide line width resolutions less than 0.20 µm. While the best resolution corresponding to sample G (see FIG. 6B) was attained using the multi-cycle process of this invention, the edges of the exposed resist were not clean, and some scum continued to persist near the edges of the electron-beam exposed resist.

EXAMPLE 4

Effect of Surfactant

A first aqueous developer solution comprising 2% w/w potassium hydroxide, 2.2% w/w diethylethanolamine, and 0.9% w/w boric acid was prepared from a stock solution. A second aqueous developer solution having approximately the same weight percent potassium hydroxide, diethylethanolamine, and boric acid as the first developer solution was prepared by mixing Shipley Microposit 2401 with the stock solution. The Shipley Microposit 2401 comprised approximately 10% v/v of the second developer solution. The concentration of the surfactant in the diluted second developer solution was approximately 0.01% w/w.

Mask plate samples were spin coated with Shipley SPR700 DNQ sensitized novolak resist. The samples were exposed to an electron beam and then developed over eight cycles of the multi-cycle process of the present invention. Each cycle included:

1) A first resist develop step, including the steps of:

spin spraying the developer composition at 100 RPM for 4 seconds;

spin spraying the developer composition at 20 RPM for 4 seconds; and puddle developing the resist at 0 RPM for 32 seconds;

2) A second resist development step, including the steps of:

spin spraying the developer composition at 100 RPM for 4 seconds;

spin spraying the developer composition at 20 RPM for 4 seconds; and puddle developing the resist at 0 RPM for 32 seconds;

3) A rinse step including spraying the resist with deionized water for 40 seconds; and 4) A drying step including spin drying the resist at 1000 RPM for 100 seconds.

The speed of the resist, as defined by the electron beam dose required to clear the exposed resist, is measured and the results for each developer solution is presented in Table III below.

TABLE III

| | Clearing Dose in µC/cm² per Number of Process Cycles/Total Development Time | | | | | |
|---|---|---|---|---|---|---|
| | 1 | 2 | 3 | 4 | 5 | 6 |
| | 80 secs. | 160 secs. | 240 secs. | 320 secs | 400 secs. | 480 secs. |
| No Surfactant | 60 | 56 | 42 | 36 | 34 | 32 |
| 0.1% Surfactant | 56 | 40 | 30 | 26 | 22 | 20 |

The speed of the novolak resist is significantly improved by the addition of the surfactant as compared to the speed using the non-surfactant control cell. This increase in speed advantageously reduces the electron beam process time as well as resist development time. Table III also shows that higher energy radiation may be used to expose the novolak resist and be successfully developed using the developer composition and process of this invention.

EXAMPLE 5

Effect of Surfactant

We have discovered that the addition of between 0.001% to about 0.5% w/w surfactant to the developer composition of this invention significantly improves the minimum feature size attainable on an electron-beam exposed novolak photoresist. In the following Table III, all samples (J through Q) were prepared using an electron beam exposed Shipley SPR700 novolak resist-coated mask plate. The samples (mask plates) were developed via an interrupted development process by immersing the plates in about 500 mL of a developer.

Samples J though M were exposed to an electron beam and developed using the surfactant and weight percent shown in Table IV in a developer composition comprising approximately 1.74% w/w potassium hydroxide, 1.98% w/w N,N diethylethanolamine, and 0.78% w/w boric acid.

Samples N through Q were exposed to an electron beam with an electron beam bit size of approximately 0.18 $\mu$m. The samples were developed using the surfactant and weight percent shown in Table IV in a developer composition comprising approximately 1.56% w/w potassium hydroxide, 0.78% w/w boric acid, and 1.98% w/w N,N diethylethanolamine.

The samples were developed over six cycles of one embodiment of the multi-cycle process of the present invention, as described below, for a total development time of approximately 480 seconds. Each cycle included:

1) An immersion development step in 500 mL of the developer solution for approximately 80 seconds;

2) A first quenching immersion rinse step in a one liter deionized water bath;

3) A second immersion rinse step in a one liter deionized water bath;

4) A spray rinse step spraying the resist with deionized water for approximately 40 seconds; and 5) A drying step including spin drying the resist at 1000 RPM for 100 seconds.

The sensitivity, contrast, and quality of the as-developed electron-beam exposed resist was measured and the results presented in Table IV below.

TABLE IV

| Sample | Surfactant [a] | Sensitivity ($\mu$C/cm$^2$) at 50 kV | Contrast | Quality of Resolution at 0.25 $\mu$m | Quality of Resolution at 0.17 $\mu$m |
|---|---|---|---|---|---|
| J | FC-129 0.028% w/w | 18 | 9.9 | Clean | Clean |
| K | FC-120 0.046% w/w | 16 | 11.1 | Clean. | Clean. |
| L | DOWFAX 2A0 0.024% w/w | 19 | 6.7 | Clean. | Clean. |
| M | DOWFAX 2A1 0.04% w/w | 19 | 3.4 | Clean. | Clean. |
| N | FC-120 0.01% w/w | 20 | 14.2 | Clean. | Clean. |
| O | FC-129 0.01% w/w | 20 | 10.9 | Clean | Clean |
| P | DOWFAX 2A0 0.01% w/w | 23 | 12.8 | Clean. | Clean. |

TABLE IV-continued

| Sample | Surfactant [a] | Sensitivity ($\mu$C/cm$^2$) at 50 kV | Contrast | Quality of Resolution at 0.25 $\mu$m | Quality of Resolution at 0.17 $\mu$m |
|---|---|---|---|---|---|
| Q | DOWFAX 2A1 0.01% w/w | 22.5 | 10.3 | Clean. | Clean. |

[a] FC-129 is a potassium fluoroalkyl carboxylate surfactant by 3M Corp.
FC-120 is an ammonium perfluoroalkyl sulfonate by 3M Corp.
DOWFAX 2A0 is benzene, 1, 1-oxybis-tetrapropylene sulfonate by Dow Chemical Corp.
DOWFAX 2A1 is a sodium salt of benzene, 1, 1-oxybis-tetrapropylene sulfonate by Dow Chemical Corp.

FIGS. 9A–9H are SEM photographs of a portion of a developed novolak resist (Shipley SPR700) corresponding to samples J through Q of Table IV above. The photographs are at 50,000 times magnification. As can clearly be seen, all samples are characterized by clean, sharp edges, and essentially no scum down to 0.175 $\mu$m. Accordingly, either of the Dow or 3M surfactants may be used in the developer composition of the present invention to attain feature sizes of less than 0.2 $\mu$m on an electron-beam exposed novolak positive photoresist.

In view of the foregoing, it will be understood that the present invention provides a developer composition comprising an metal/organic alkali, and optionally, a surfactant, and a buffer. It is evident that the composition of this invention advantageously increases the speed of novolak resin-based resists exposed to short wavelength radiation to permit developing an image even when the manufacturer recommended developer compositions are ineffective. It is also evident that the composition of this invention produces an as-developed resist pattern characterized by clean sharp resist edges, and the absence of scum.

The present invention also includes a multi-cycle process for developing high-energy radiation exposed novolak resists. It is evident that the process results in nearly ideal anisotropic dissolution of exposed novolak resist as a result of the formation of what is believed to be an oxidized passivation layer in the resist during spin dry. Consequently, resist erosion and undercutting is essentially eliminated. It is also evident that the combination of the multi-cycle process and the composition of this invention results in an on-mask resist resolution capability of less than 0.20 $\mu$m, thereby in turn permitting an on-wafer minimum feature size of less than 130 nm.

What is claimed is:

1. An aqueous developer composition for developing an electron beam-exposed photoresist resin, comprising:
   a) a metal alkali;
   b) a dialkylalkanolamine adjuvant;
   c) an ionic surfactant; and
   d) a boric acid buffer, the composition having a sum of a concentration of the metal alkali and the dialkylalkanolamine adjuvant of between about 1.6 and about 6.1 weight percent; a surfactant concentration of between about 0.001 and about 0.5 weight percent; and a boric acid concentration of between about 0.6 and about 1.5 weight percent, wherein said developer composition develops features of about 0.2 $\mu$m minimum size in said electron-beam exposed photoresist resins.

2. The aqueous developer composition of claim 1 wherein said boric acid buffer is present in an amount ranging from about 0.75 to about 1.2 weight percent.

3. The aqueous developer composition of claim 1 wherein said metal alkali is selected from the group consisting essentially of alkali metal hydroxides, phosphates, carbonates, hydrogen carbonates, pyrophosphates, and mixtures thereof.

4. The aqueous developer composition of claim 1 wherein said dialkylalkanolamine adjuvant is selected from the group consisting of diethylethanolamine, diethylmethanolamine, dimethylethanolamine, dimethylmethanolamine, and mixtures thereof.

5. The aqueous developer composition of claim 1 wherein said metal alkali is potassium hydroxide, and said potassium hydroxide and said surfactant is a premixed metal-alkali/surfactant composition used for developing ultraviolet light-exposed positive photoresists.

6. The aqueous developer composition of claim 5 wherein said premixed metal-alkali/surfactant composition is combined with additional potassium hydroxide, diethylethanolamine, and boric acid to provide an aqueous developer composition having a potassium hydroxide concentration of between about 1 to about 3 weight percent, a diethylethanolamine concentration in the range of from about 1.5 to about 2.5 weight percent, a boric acid concentration in the range of from about 0.8 to about 1.2 weight percent, and a surfactant concentration of less than about 0.1 weight percent.

7. The aqueous developer composition of claim 1 wherein said surfactant is selected from the group consisting essentially of alkylbenzene sulfonates and alkali metal salts thereof, alkylated diphenyl disulfonates and alkali metal salts thereof, alkyl aryl sulfonates, alkali metal fluoroalkyl carboxylate salts, ammonium perfluoroalkyl sulfonates, and mixtures thereof.

8. The aqueous developer composition of claim 7 wherein said surfactant is an ammonium perfluoroalkyl sulfonate having the general formula:

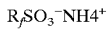

where: $R_f=C_nF_{2n+1}$; and n is from six to about 12 carbons.

9. The aqueous developer composition of claim 7 wherein said surfactant is potassium fluoroalkyl carboxylate, said fluoroalkyl moiety having from about six to about 12 carbons.

10. The aqueous developer composition of claim 7 wherein said surfactant is benzene, 1-1-oxybis-tetrapropylene sulfonate.

11. The aqueous developer composition of claim 7 wherein said surfactant is sodium salts of benzene, 1-1-oxybis-tetrapropylene sulfonate.

12. The aqueous developer of claim 1 wherein said metal alkali is potassium hydroxide in an amount ranging from about 1.5 to about 4 weight percent, said dialkylalkanolamine is diethylethanolamine in an amount ranging from about 3 to about 0.1 weight percent, said boric acid buffer is in an amount ranging from about 0.6 to about 1.5 weight percent, and said surfactant is selected from the group consisting of ammonium perfluoroalkyl sulfonate, potassium fluoroalkyl carboxylate, benzene, 1-1-oxybis-tetrapropylene sulfonate, and sodium salts of benzene, 1-1-oxybis-tetrapropylene sulfonate, said surfactant present in an amount less than about 0.1 weight percent.

* * * * *